United States Patent
Tajima

(10) Patent No.: US 10,256,725 B2
(45) Date of Patent: Apr. 9, 2019

(54) CURRENT DETECTION CIRCUIT AND DCDC CONVERTER INCLUDING THE SAME

(71) Applicant: RENESAS ELECTRONICS CORPORATION, Tokyo (JP)

(72) Inventor: Hideyuki Tajima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/461,687

(22) Filed: Mar. 17, 2017

(65) Prior Publication Data

US 2017/0279357 A1    Sep. 28, 2017

(30) Foreign Application Priority Data

Mar. 23, 2016  (JP) ................. 2016-057925

(51) Int. Cl.
| H02M 1/00 | (2006.01) |
| H02M 1/08 | (2006.01) |
| H02M 3/158 | (2006.01) |
| G01R 15/14 | (2006.01) |
| G01R 31/40 | (2014.01) |
| G01R 19/00 | (2006.01) |

(52) U.S. Cl.
CPC .......... *H02M 3/158* (2013.01); *G01R 15/146* (2013.01); *G01R 19/0092* (2013.01); *G01R 31/40* (2013.01); *H02M 1/08* (2013.01); *H02M 2001/0009* (2013.01)

(58) Field of Classification Search
CPC ......... H02M 3/155; H02M 2001/0025; H02M 3/156; H02M 3/158; H02M 1/08; H02M 1/083; G01R 15/156; G01R 19/0092; G01R 31/40; H03K 2217/0027
See application file for complete search history.

(56) References Cited

U.S. PATENT DOCUMENTS

| 5,917,312 A * | 6/1999 | Brkovic ................ H02M 3/156 323/282 |
| 6,377,034 B1 | 4/2002 | Ivanov |
| 2010/0164453 A1* | 7/2010 | Bea ........................ H02M 3/156 323/282 |
| 2010/0289473 A1* | 11/2010 | Ishii ...................... H02M 3/156 323/284 |
| 2013/0320960 A1* | 12/2013 | Fosas ................. G01R 19/0092 324/120 |
| 2014/0253062 A1* | 9/2014 | Qin .......................... G05F 1/10 323/271 |

(Continued)

*Primary Examiner* — Gustavo Rosario Benitez
(74) *Attorney, Agent, or Firm* — McDermott Will & Emery LLP

(57) ABSTRACT

According to an embodiment, a current detection circuit includes a transistor, an operational amplifier, and a transistor. In the transistor, the source and the gate are coupled to the source and the gate of a transistor which is provided on a high side of a drive circuit. The operational amplifier amplifies a potential difference between a drain voltage of the transistor and a drain voltage of the transistor. The transistor is provided over a current path through which a current flowing to the transistor flows, and which has the gate to which an output voltage of the operational amplifier is supplied. A value of the current flowing through the transistor is detected based on a value of the current flowing through the transistor.

14 Claims, 15 Drawing Sheets

(56) References Cited

U.S. PATENT DOCUMENTS

| | | | | |
|---|---|---|---|---|
| 2014/0253089 A1* | 9/2014 | Qin | ..................... | H02M 3/158 |
| | | | | 323/316 |
| 2014/0347078 A1* | 11/2014 | Qin | ................... | G01R 19/0092 |
| | | | | 324/713 |
| 2015/0346241 A1* | 12/2015 | van Dijk | ............ | G01R 19/0023 |
| | | | | 324/123 R |
| 2017/0025951 A1* | 1/2017 | Gambetta | ............. | H02M 3/158 |

* cited by examiner

CURRENT DETECTION CIRCUIT AND DCDC CONVERTER INCLUDING THE SAME

CROSS-REFERENCE TO RELATED APPLICATIONS

The disclosure of Japanese Patent Application No. 2016-057925 filed on Mar. 23, 2016 including the specification, drawings and abstract is incorporated herein by reference in its entirety.

The present invention relates to a current detection circuit and a DCDC converter including the circuit, and relates, for example, to a current detection circuit capable of cost reduction and a DCDC converter including the circuit.

BACKGROUND

U.S. Pat. No. 6,377,034 discloses a configuration of a current detection circuit which detects a current flowing through a drive circuit.

Specifically, the current detection circuit is a circuit for detecting a current flowing through an N-channel drive transistor provided on a high side of the drive circuit. The current detection circuit has at least a sense transistor, an operational amplifier, and a transistor. The sense transistor has a drain and a gate which are coupled respectively to a drain and a gate of the drive transistor. The operational amplifier amplifies a potential difference between a source voltage of the sense transistor and a source voltage of the drive transistor. The transistor is coupled in series with the sense transistor, and has a gate to which an output voltage of the operational amplifier is supplied.

A gate-source voltage and a drain-source voltage of the sense transistor respectively indicate the same values as a gate-source voltage and a drain-source voltage of the drive transistor. Thus, through the sense transistor, a current (for example, a current of one thousandth) proportional to a current flowing through the drive transistor flows. The current detection circuit detects the current flowing through the sense transistor, thereby enabling to detect with high accuracy the current (more specifically, the current flowing between the drain and the source of the drive transistor) flowing through the drive circuit.

SUMMARY

In the configuration of the current detection circuit disclosed in U.S. Pat. No. 6,377,034, if a switching frequency of the drive transistor provided in the drive circuit is high, a voltage supplied to an input terminal of the operational amplifier is quickly switched between the ground voltage and the input voltage. Thus, the operational amplifier is required to perform a very high-speed operation. In the current detection circuit disclosed in U.S. Pat. No. 6,377,034, the expensive operational amplifier applicable to the high-speed operation is necessary. This results in an increase in the manufacturing cost. Other objects and new features will be apparent from the descriptions of the present specification and the accompanying drawings.

According to an embodiment, there is provided a current detection circuit including: a first sense transistor which includes a first terminal and a control terminal which are coupled respectively to a first terminal provided on an external output terminal side outputting externally an output voltage of the drive circuit and a control terminal, of terminals of a first drive transistor provided on a high side of a drive circuit, the first sense transistor being a same conductive type as the first drive transistor; a first operational amplifier which amplifies a potential difference between a voltage of a second terminal provided on an external input terminal side to which an input voltage is supplied externally from the drive circuit and a voltage of a second terminal of the first sense transistor, of the terminals of the first drive transistor; and a first current control transistor which is provided over a first current path through which a current from the first sense transistor flows, and which has a control terminal to which an output voltage of the first operational amplifier is supplied. A value of a current flowing through the first drive transistor is detected from a value of the current flowing through the first sense transistor.

According to an embodiment, there is provided a current detection circuit comprising: art N-channel first sense transistor having a source and a gate which are coupled respectively to a source and a gate of an N-channel first drive transistor provided on a high side of a drive circuit; a first operational amplifier which amplifies a potential difference between a drain voltage of the first drive transistor and a drain voltage of the first sense transistor; and a first current control transistor which is provided over a first current path through which a current flowing through the first sense transistor flows, and which has a gate to which an output voltage of the first operational amplifier is supplied. A value of a current flowing through the first drive transistor is detected based on a value of the current flowing through the first sense transistor.

According to the embodiment, it is possible to provide a current detection circuit which can suppress an increase in the manufacturing cost and a DCDC converter including the same.

DETAILED DESCRIPTION

Figure 1:
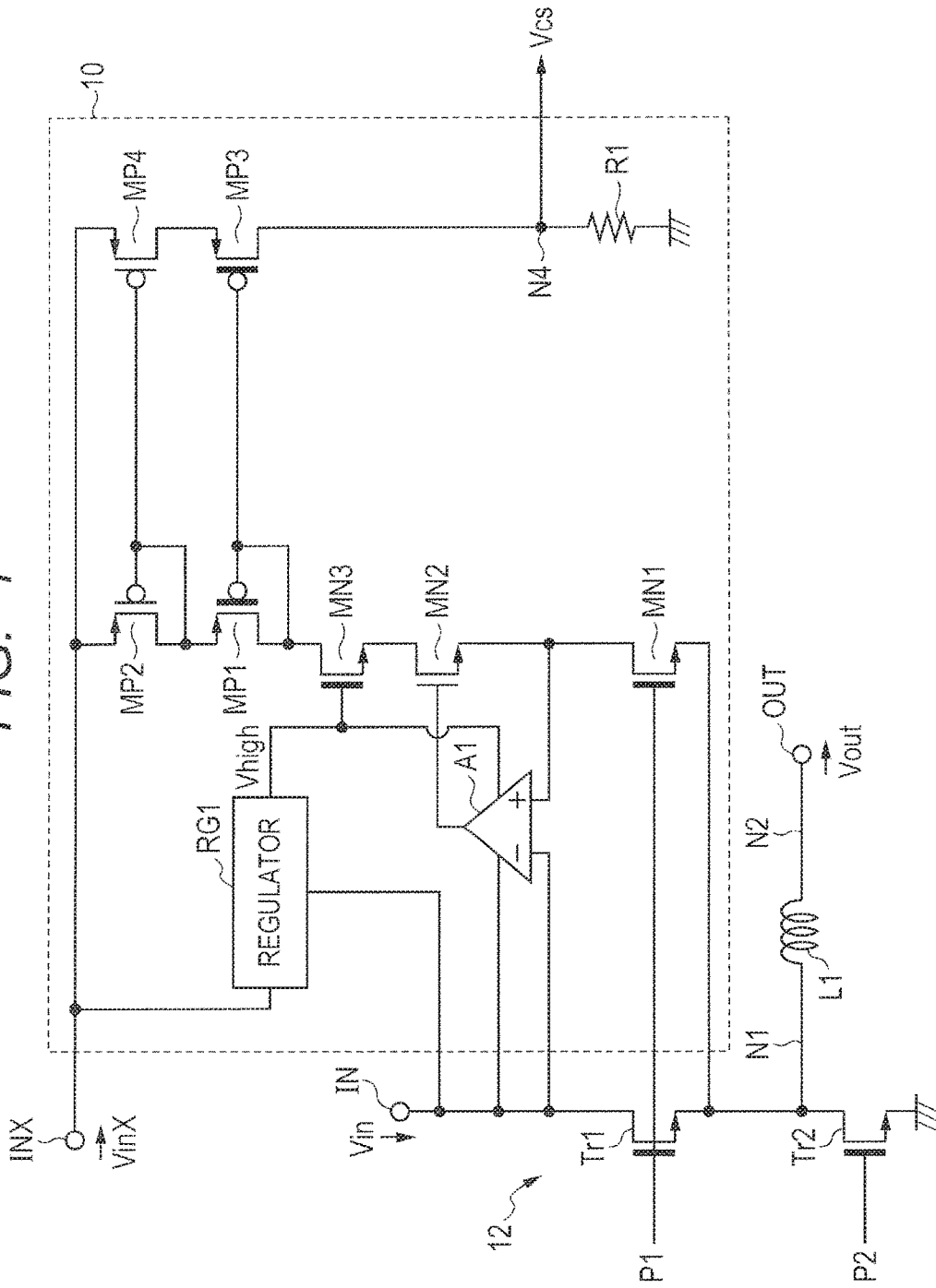
FIG. 1 is a diagram illustrating a configuration example of a current detection circuit according to an embodiment 1.

Preferred embodiments will hereinafter be described with reference to the accompanying drawings. The simplified drawings are given, and the technical range of the preferred embodiments is not to be narrowly interpreted based on the drawings. The same elements are identified by the same reference numerals, and thus will not be described repeatedly over and over.

In the following preferred embodiments, if necessary for convenience sake, descriptions will be made to divided plural sections or preferred embodiments, however, unless otherwise specified, they are not mutually irrelevant, but one is in relations of modifications, application examples, details, supplementary explanations of a part or whole of the other. Further, in the following preferred embodiments, in the case of reference to the number of an element (including quantity, numeric value, amount, range), unless otherwise specified and unless clearly limited in principle, the present invention is not limited to the specified number, and a number over or below the specified one may be used.

In the following preferred embodiments, the constituent elements (including operation steps) are not necessarily indispensable, unless otherwise specified and unless considered that they are obviously required in principle. Similarly, in the following preferred embodiments, in the reference of the forms of the constituent elements or the positional relationships, they intend to include those approximating or similar substantially to the forms and like, unless otherwise specified and unless considered that they are obviously not required in principle. This is also true of the foregoing numerical values (including quantity, numeric value, amount, range).

Embodiment 1

FIG. 1 is a block diagram illustrating a current detection circuit 10 according to an embodiment 1. The current detection circuit 10 according to this embodiment is a circuit for detecting a current flowing between the drain and the source of an N-channel drive transistor provided on the high side of a drive circuit.

As illustrated in FIG. 1, the current detection circuit 10 includes transistors MN1 to MN3 and NP1 to MP4, an operational amplifier (a first operational amplifier) A1, a resistance element R1, and a regulator PG1. FIG. 1 also illustrates transistors Tr1 and Tr2 and an inductor L1, as a part of the constituent elements provided in the drive circuit 12.

The drive circuit 12 is a circuit for driving an input voltage Vin and outputting an output voltage Vout, and is provided at an output stage of a step-down DCDC converter which uses, for example, a peak current mode control system.

In the drive circuit 12, the transistor Tr1 is a drive transistor (a first drive transistor) provided on the high side of the drive circuit 12, and is configured with a high withstand voltage N-channel MOS transistor. The transistor Tr2 is a drive transistor (a second drive transistor) provided on the low side of the drive circuit 12, and is configured with a high withstand voltage N-channel MOS transistor.

More specifically, in the transistor Tr1, the drain (a second terminal) is coupled to an input terminal IN, the source (a first terminal) is coupled to one end (a node N1) of the inductor L1, and a pulse signal P is supplied to the gate (a control terminal) from a control unit (not illustrated). In the transistor Tr2, the drain (a second terminal) is coupled to the node N1, the source a first terminal) is coupled to a ground voltage terminal GND, and a pulse signal P2 is supplied to the gate (a control terminal) from a control unit (not illustrated). An input voltage Vin is supplied externally to the input terminal IN, and a ground voltage GND is supplied to the ground voltage terminal GND. The other end (a node N2) of the inductor is coupled to an output terminal OUT. The output terminal OUT externally (load) outputs an output voltage Vout.

In the drive circuit 12, the transistors Tr1 and Tr2 are controlled to be turned ON/OFF complementarily based on the dead time existing therebetween. For example, first, the transistor Tr1 is turned ON, and the transistor Tr2 is turned OFF. Then, a current flows from the input terminal IN toward the output terminal OUT through the transistor Tr1 and the inductor L1. At this time, the inductor L1 is charged with current energy. After this, the transistor Tr1 is turned OFF, and the transistor Tr2 is turned ON. As a result, the current flowing from the input terminal IN to the inductor L1 through the transistor Tr1 is cut off. To maintain a current value of the previously flowing current, the inductor L1 discharges the charged current energy toward the output terminal OUT. This causes a current to flow from the ground voltage terminal ND to the output terminal OUT through the transistor Tr2. By repeating this operation, the drive circuit 12 outputs an output voltage gout which is obtained by stepping down the input voltage yin by a certain level corresponding to a duty ratio of a pulse signal.

In the current detection circuit 10, the transistor (a first sense transistor) MN1 is configured with a high withstand voltage N-channel MOS transistor, like the transistor Tr1. For example, the transistor size of the transistor MN1 is one thousandths of the transistor size of the transistor Tr1.

The transistor MN1 is provided over a current path (a first current path) between a high voltage terminal INX to which a voltage VinX higher than the input voltage Vin is supplied and the source (the node N1) of the transistor Tr1. To its gate, a pulse signal P1 is supplied.

The operational amplifier A1 operates, upon supplying the input voltage Vin as a low potential side source voltage and a voltage (a first voltage) Vhigh higher than the input voltage Vin as a high potential side source voltage. The amplifier amplifies a potential difference between the drain voltage (that is, the input voltage Vin) of the transistor Tr1 and the drain voltage of the transistor MN1.

In this case, the operational amplifier A1 does not amplify the potential difference between the source voltage of the transistor Tr1 and the source voltage of the transistor MN1, but amplifies the potential difference between the drain voltage of the transistor Tr1 and the drain voltage of the transistor MN1. As a result, even when the transistor Tr1 is switched between ON/OFF states quickly, the voltage to be supplied to the input terminal of the operational amplifier A1 is not quickly switched. Thus, the operational amplifier A1 is not required to perform a high-speed operation. The current detection circuit 10 does not need to use the expensive operational amplifier applicable to the high-speed operation, thereby enabling to suppress the increase in the manufacturing cost.

It is adjusted that the potential difference between the high potential side source voltage (the voltage Vhigh) and the low potential side source voltage (the input voltage Vin) supplied to the operational amplifier A1 becomes equal to or lower than the withstand voltage of each transistor included in the operational amplifier Specifically, it is adjusted by controlling the value of the voltage Vhigh generated by the regulator RG1. Therefore, it is not limited that the operational amplifier A1 is configured with the high withstand voltage transistor, and it is possible that the amplifier is configured with the low withstand voltage transistor. This enables to improve the accuracy or the operational speed of the operational amplifier A1.

The output voltage of the operational amplifier A1 is supplied to the gate of the transistor (a first current control transistor) MN2. The transistor NN2 is configured with a low withstand voltage N-channel MOS transistor, and is provided in series with the transistor MN1 over the current path between the high voltage terminal INX and the node N1. In this case, the drain voltage of the transistor Tr1 is mirrored to the drain voltage of the transistor MN1.

The gate-source voltage and the drain-source voltage of the transistor MN1 indicate the same values as the gate-source voltage and the drain-source voltage of the transistor Tr1. Thus, between the drain and the source of the transistor MN1, a current (in this example, a current of one thousandth) proportional to a current flowing between the drain and the source of the transistor Tr1 flows with high accuracy.

The transistor MN3 is configured with a high withstand voltage N-channel MOS transistor, and is provided in series with the transistor MN2. A voltage Vhigh is supplied to the gate of the transistor MN3 from the regulator RG1. The transistor MN3 is provided for preventing application of a voltage greater than a withstand voltage to the transistor MN2. Thus, when the transistor MN2 is configured with a high withstand transistor, the transistor MN3 is not necessarily provided.

A transistor MP2 is configured with a low withstand voltage P-channel MOS transistor, and is provided in series with the transistors MN1 to MN3. A transistor MP4 is configured with a low withstand voltage P-channel MOS transistor, and is provided over a current path between the high voltage terminal INX and the ground voltage terminal GND as a current path different from, the transistor MP2. The gate of the transistor MP4 is coupled to the drain and the gate of the transistor MP2. Thus, between the drain and the source of the transistor MP4, a current proportional to the current flowing between the drain and the source of the transistor MP2 flows. That is, the transistors MP2 and MP4 are included in a current mirror circuit.

The transistor MP1 is configured with a high withstand voltage P-channel MOS transistor, and provided in series with the transistor MP2 and also the transistors MN1 to MN3. The transistor MP3 is configured with a high withstand voltage P-channel MOS transistor, and is provided in series with the transistor MP4. The gate of the transistor MP3 is coupled to the drain and the gate of the transistor MP1. Between the drain and the source of the transistor MP3, a current proportional to the current flowing between the drain and the source of the transistor MP1 flows. That is, the transistors MP1 and MP3 are included in a current mirror circuit. The transistors MP1 and MP3 are provided for preventing application of a voltage greater than a withstand voltage respectively to the transistors MP2 and MP4. Thus, when the transistors MP2 and MP4 are configured with a high withstand voltage transistor, the transistors MP1 and MP3 are not necessarily provided.

The resistance element R1 is provided in series with the transistors MP3 and MP4. Through the resistance element R1, a current proportional to the current flowing through the transistor MN1 flows. Through the transistor MN1, a current proportional to the current flowing through the transistor Tr1 flows. Thus, through the resistance element R1, a current proportional to the current flowing through the transistor Tr1 flows. As a result, it is possible to obtain a value of the current flowing through the transistor Tr1, from a voltage (a voltage of a node N4 between the drain and the resistance element R1 of the transistor MP3) generated based on a value of the current flowing through the resistance element R1 and a resistance value of the resistance element R1. The voltage of this node N4 is output to the outside of the current detection circuit 10 as a detection result Vcs.

In this manner, in the current detection circuit 10 according to this embodiment, the operational amplifier A1 does not amplify the potential difference between the source voltage of the transistor Tr1 and the source voltage of the transistor MN1, but amplifies the potential difference between the drain voltage of the transistor Tr1 and the drain voltage of the transistor MN1. Even when the transistor Tr1 is switched between ON/OFT states quickly, the voltage to be supplied to the input terminal of the operational amplifier A1 is not quickly switched. Thus, the operational amplifier A1 is not required to perform a high-speed operation. The current detection circuit 10 does not need to use the expensive operational amplifier applicable to the high-speed operation, thereby enabling to suppress the increase in the manufacturing cost.

In the current detection circuit 10 according to this embodiment, it is adjusted that the potential difference between the high potential side source voltage (the voltage Vhigh) and the low potential side source voltage (the input voltage Vin) supplied to the operational amplifier A1 becomes equal to or lower than the withstand voltage of each transistor included in the operational amplifier A1. Therefore, it is not limited that the operational amplifier A1 is configured with the high withstand voltage transistor, and it is possible that the amplifier is configured with the low withstand voltage transistor. This enables to improve the accuracy or the operational speed of the operational amplifier A1.

(Application Example of Current Detection Circuit 10)

Figure 2:
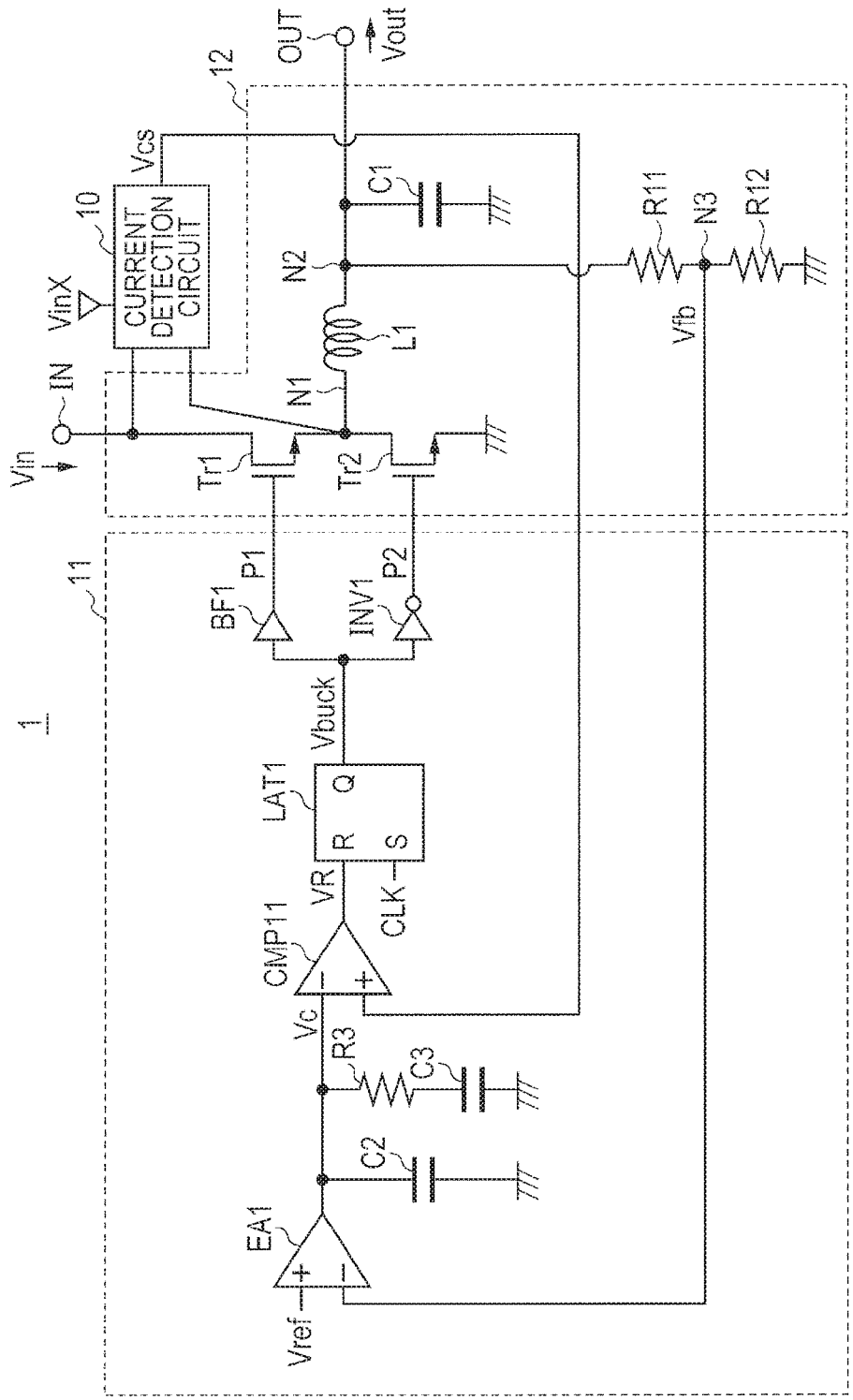
FIG. 2 is a diagram illustrating a configuration example of a DCDC converter over which the current detection circuit illustrated in FIG. 1 is mounted.
Figure 3:
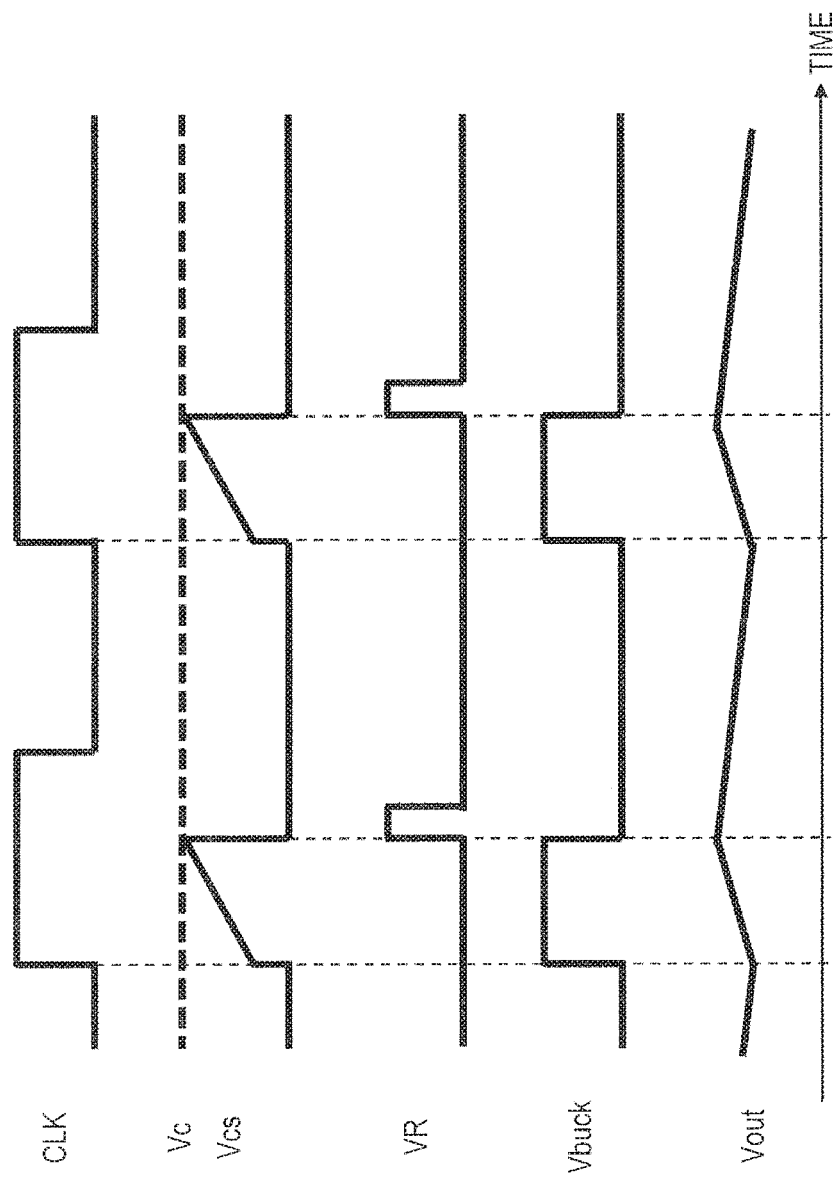
FIG. 3 is a timing chart illustrating an operation of the DCDC converter illustrated in FIG. 2.

FIG. 2 is a diagram illustrating a configuration example of a step-down DCDC converter 1 over which the current detection circuit 10 is mounted. FIG. 3 is a timing chart illustrating an operation of the DCDC converter 1. The DCDC converter 1 uses a peak current mode control system as one control system for the output voltage.

As illustrated in FIG. 2, the DCDC converter 1 includes a current detection circuit 10, a drive circuit 12, and a control unit 11. The drive circuit 12 has transistors Tr1 and Tr2, an inductor L1, a capacitance element C1, and resistance elements R11 and R12. The control unit 11 has an error amplifier EA1, capacitance elements C2 and C3, a resistance element. R3, a comparator CMP1, a latch circuit LAT1, a buffer BF1, and an inverter INV1.

In the drive circuit 12, the capacitance element C1 is provided between the output terminal OUT and the ground voltage terminal GND. The resistance elements R11 and R12 are provided in series between the output terminal OUT and the ground voltage terminal GND. A voltage Vfb of the node N3 between the resistance elements R11 and R12 is obtained by the resistance elements R11 and R12 dividing the output voltage Vout, and is fed back to the control unit 11. Any other configurations of the drive circuit 12 are as described above. The operation of the drive circuit 12 is also as described above.

The current detection circuit 10 detects the current flowing through the transistor Tr1 provided on the high side of the drive circuit 12, as described above, and outputs a detection result Vcs. The detection result Vcs is fed back to the control unit 11.

In the control unit 11, the error amplifier EA1 amplifies a potential difference between a reference voltage Vref and a voltage Vfb fed back from the drive circuit 12, to generate a voltage Vc. The voltage Vc is integrated by the capacitance element C2 provided between the output terminal and the ground voltage terminal GND of the error amplifier EA1 or by the capacitance element C3 and the resistance element R3 which are provided in series between the output terminal and the ground voltage terminal GND of the error amplifier EA1.

For example, when the output voltage Vout decreases, and when the voltage Vfb is lower than the reference voltage Vref, the output voltage Vc of the error amplifier EA1 increases at the rate proportional to the potential difference between the voltage Vfb and the reference voltage Vref. On the contrary, when the output voltage Vout increases, and when the voltage Vfb is higher than the reference voltage Vref, the output voltage Vc of the error amplifier EA1 decreases at the rate proportional to the potential difference between the voltage Vfb and the reference voltage Vref. In the example of FIG. 3, the potential difference between the output voltage Vout and the reference voltage Vref is small. Thus, the output voltage Vc of the error amplifier EA1 indicates a constant value.

The comparator CMP1 compares an output voltage (a reference voltage for the comparator CMP1 of the error amplifier EA1 with the detection result Vcs of the current detection circuit 10, and outputs a comparison result VR. In the latch circuit LAT1, a clock signal CLK is supplied to a set terminal S, the comparison result VR of the comparator CMP1 is supplied to a reset terminal R, and an output terminal Q outputs a signal Vbuck. The buffer BF1 outputs the signal Vbuck as is as a pulse signal P1. The inverter INV1 inverts the signal Vbuck, and outputs it as a pulse signal P2.

With reference to FIG. 3, when the transistor Tr1 is turned OFF, the potential of the detection result Vcs indicates 0V. Thus, the comparator CMP1 outputs a comparison result VR with an L level. At this time, the latch circuit LAT1 causes the signal Vbuck to rise in synchronization with rising of the clock signal CLK. As a result, the transistor Tr1 is turned ON, and the transistor Tr2 is turned OFF. When the transistor Tr1 is turned ON, a current flows between the drain and the source of the transistor Tr1. Thus, the potential of the detection result Vcs increases in proportion to the elapse of the time in which the current flows. When the detection result Vcs reaches the voltage Vc, the comparator CMP1 causes the comparison result VR to be switched from the L level to the H level. At this time, the latch circuit LAT1 causes the signal Vbuck to rise in synchronization with rising of the comparison result VR. As a result, the transistor Tr1 is turned ON, and the transistor Tr2 is turned ON. When the transistor Tr1 is turned OFF, the potential of the detection result Vcs indicates 0V. Thus, the comparison result VR of the comparator CMP1 is soon switched from the H level to the L level. By repeating this operation, the DCDC converter 1 steps down the input voltage Vin to a desired level, and outputs it as an output voltage Vout.

This DCDC converter 1 is mounted, for example, over the vehicles. In recent years, it is demanded that the DCDC converter mounted over the vehicle perform a high speed switching operation. Thus, it is effective to apply the current detection circuit 10 without being effected by the high speed switching operation. Further, the current detection circuit 10 can realize the operation with high accuracy by using the operational amplifier A1 configured with a low withstand transistor. In this case, it is possible to design the DCDC converter 1 on the assumption that the accuracy variation is small. The DCDC converter 1 can increase the loop band.

Subsequently, descriptions will hereinafter be made to some modifications of the current detection circuit 10.
(First Modification of Current Detection Circuit 10)

Figure 4:
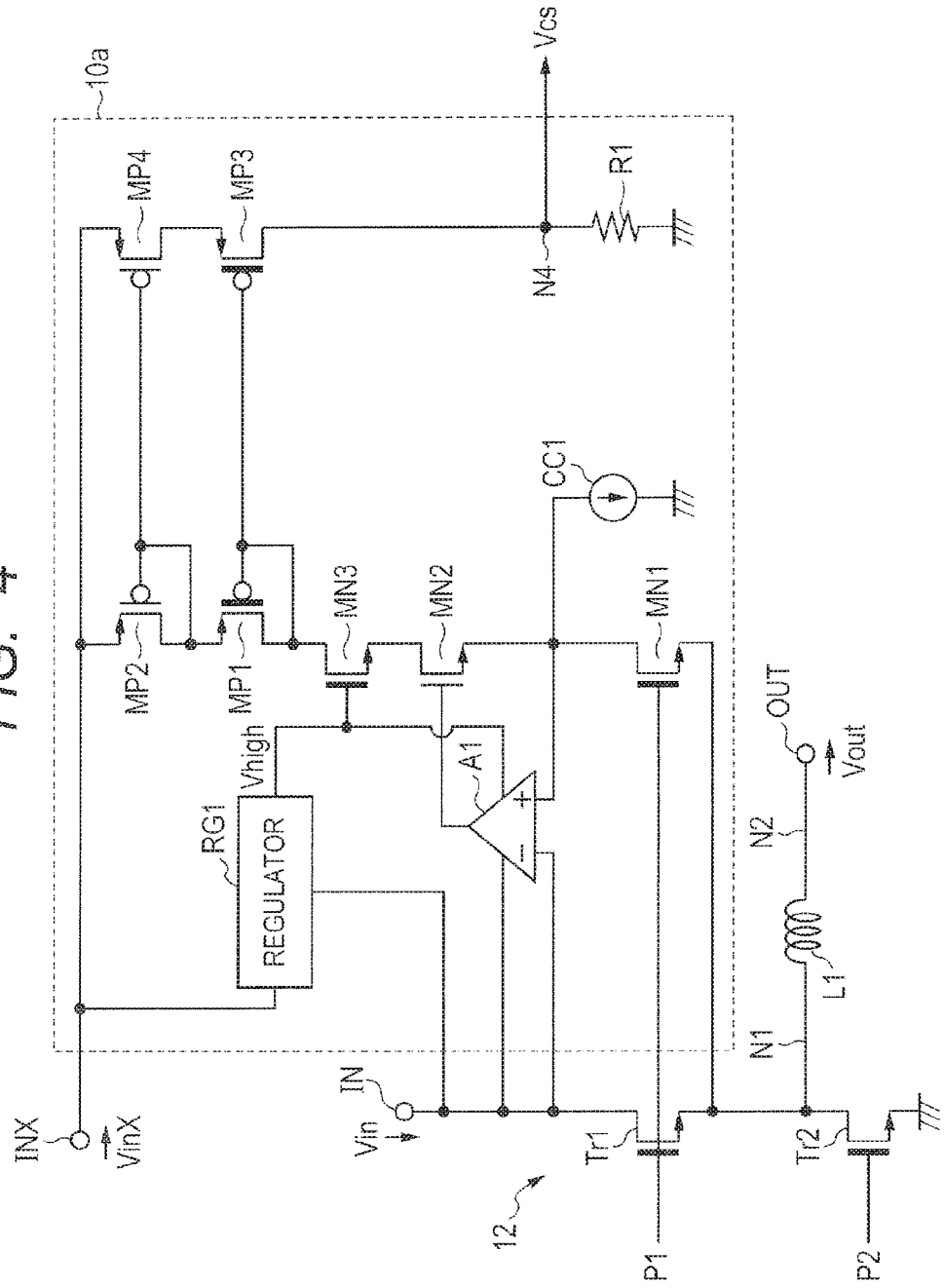
FIG. 4 is a diagram illustrating a first modification of the current detection circuit illustrated in FIG. 1.

FIG. 4 is a diagram illustrating a first modification of the current detection circuit 10 as a current detection circuit 10a.

As compared with the current detection circuit 10 illustrated in FIG. 1, the current detection circuit 10a illustrated in FIG. 4 further has a current path (a third current path) for discharging a current flowing from the source to the drain of the transistor MN1, between the drain and the ground voltage terminal CND of the transistor MN1.

More specifically, there is provided a constant current source (a first constant current source) CC1 for causing a constant current to flow from the drain to the ground voltage terminal GND of the transistor MN1, between the drain and the ground voltage terminal. GND of the transistor MN1. Any other configurations of the current detection circuit 10a are the same as those of the current detection circuit 10, and thus will not be described repeatedly over and over.

By the effect of an offset voltage of the operational amplifier A1, the drain voltage of the transistor MN1 may undesirably be lower than the source voltage. If there is not provided a current path for discharging the current flowing from the source to the drain of the transistor MN1, no current flows from the source to the drain of the transistor MN1, thereby not enabling to perform current detection in consideration of the offset voltage.

The current detection circuit 10a has a current path provided for discharging the current flowing from the source to the drain of the transistor MN1. In this configuration, when the drain voltage of the transistor MN1 is lower than the source voltage by the effect of the offset voltage, the current detection circuit 10a can cause the current to flow from the source to the drain of the transistor MN1, thereby enabling to perform current detection in consideration of the offset voltage.
(Second Modification of Current Detection Circuit 10)

Figure 5:
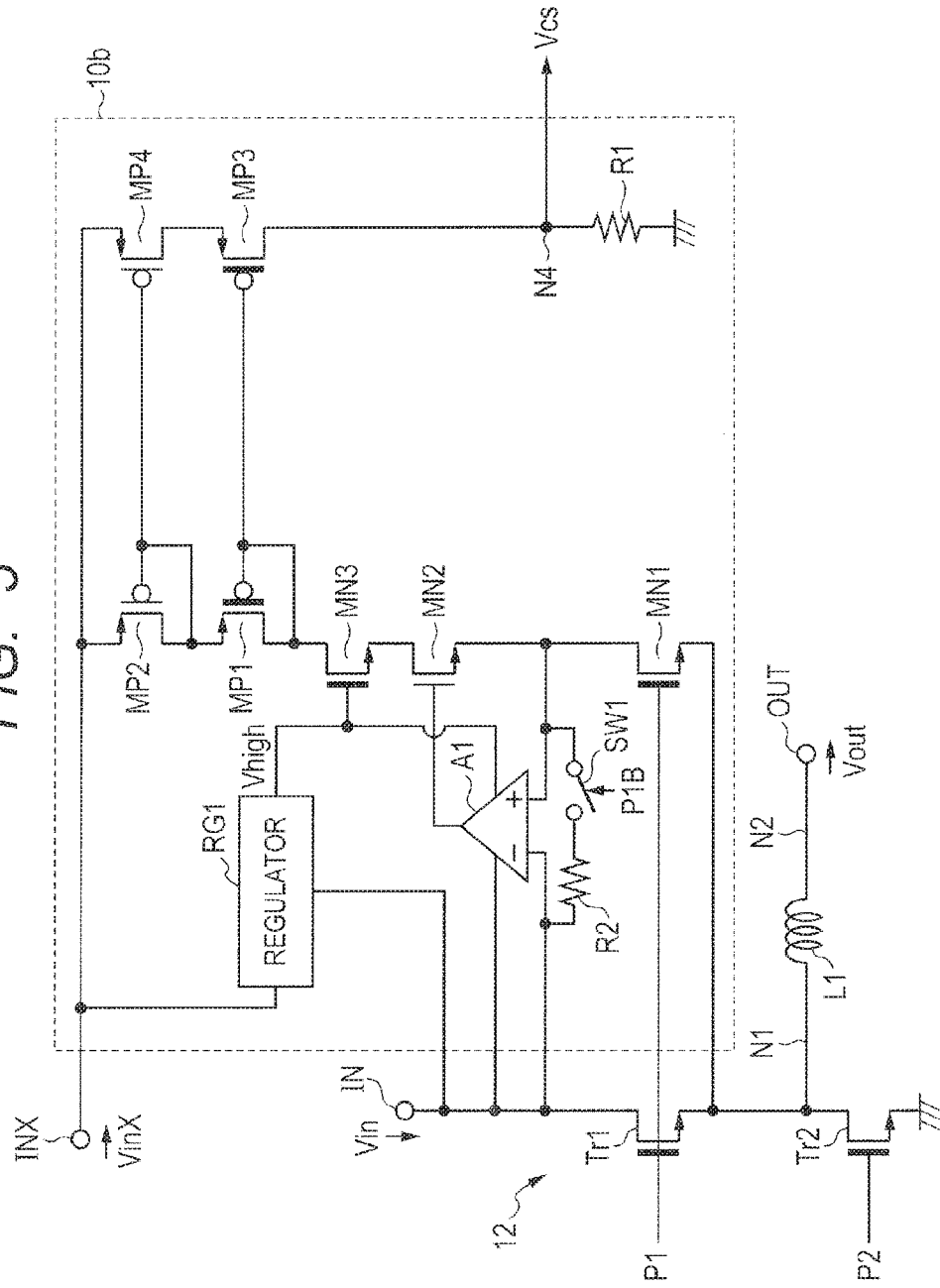
FIG. 5 is a diagram illustrating a second modification of the current detection circuit illustrated in FIG. 1.

FIG. 5 is a diagram illustrating a second modification of the current detection circuit 10 as a current detection circuit 10b.

As compared with the current detection circuit 10 illustrated in FIG. 1, the current detection circuit 10b illustrated in FIG. 5 further includes a resistance element (a first resistance element) R2 and a switch element (a first switch element) SW1.

The resistance element R2 and the switch element SW1 are provided in series between two input terminals of the operational amplifier A1. The switch element SW1 is turned ON/OFF based on an inverted signal PIP of the pulse signal P1. That is, the switch element SW is controlled to be turned ON/OFF complementarily with the transistors Tr1 and MN1. For example, the resistance value of the resistance element R2 indicates the same value as the resistance value at the time the transistor MN1 is ON. Any other configurations of the current detection circuit 10b are the same as those of the current detection circuit 10, and thus will not be described repeatedly over and over.

Even if the transistor MN1 is turned OFF, the load of the operational amplifier A1 by the resistance element is constantly maintained, because the switch element SW1 is turned ON. As a result, the current detection circuit 10b can suppress the settling time of the operational amplifier A1 after the transistor MN1 is switched between ON/OFF states, thereby realizing the high speed operation.

There may be provided a transistor which is controlled to be turned ON/OFF complementarily with the transistor instead of the resistance element R2 and the switch element SW1. This transistor is configured with a high withstand voltage N-channel MOS transistor having the same size as, for example, the transistor MN1.

(Third Modification of Current Detection Circuit 10)

Figure 6:
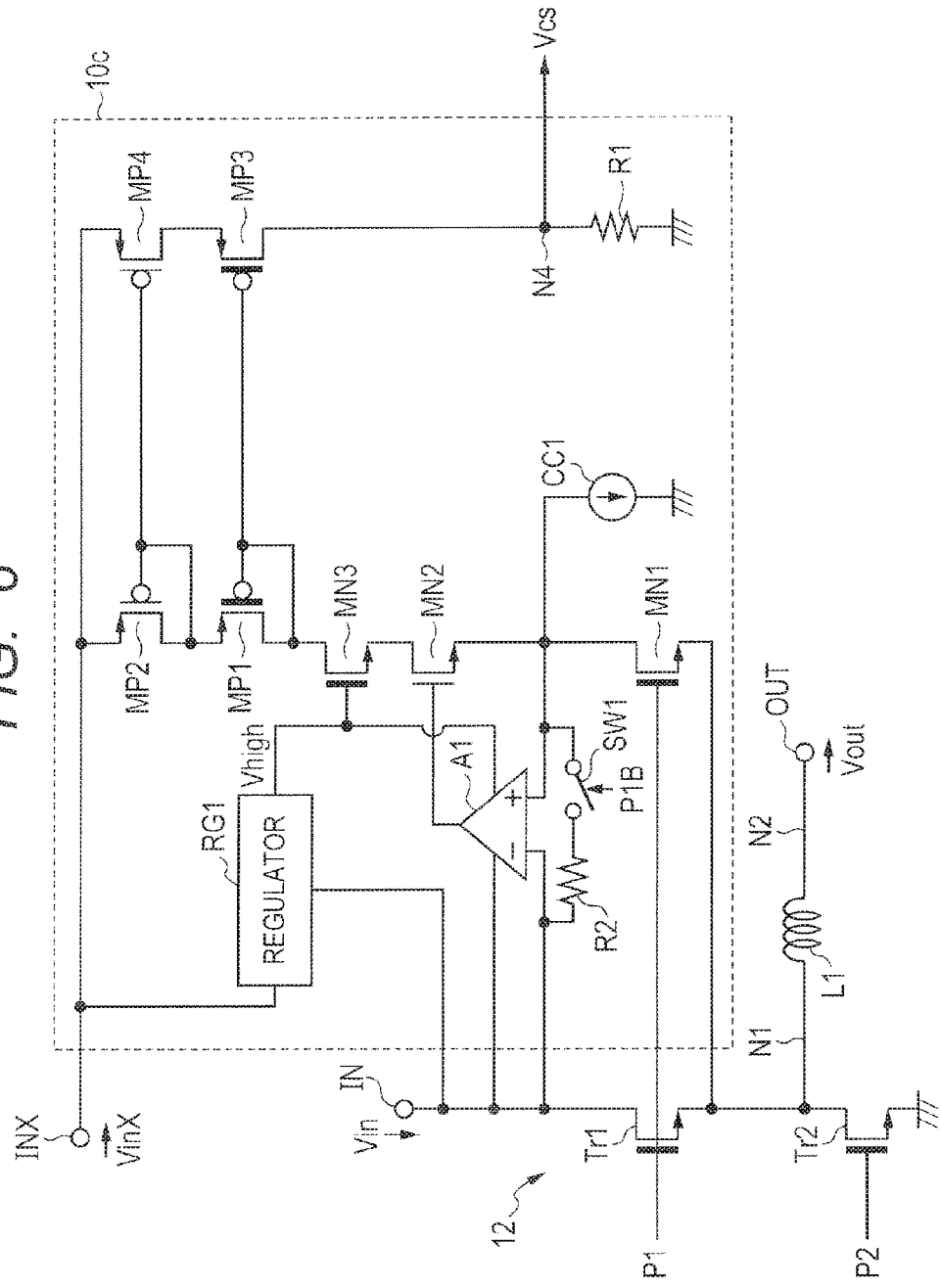
FIG. 6 is a diagram illustrating a third modification of the current detection circuit illustrated in FIG. 1.

FIG. 6 is a diagram illustrating a third modification of the current detection circuit 10 as a current detection circuit 10c.

As compared with the current detection circuit 10 illustrated in FIG. 1, the current detection circuit 10c illustrated in FIG. 6 further includes a current path including a constant current source CC1 between the drain and the ground voltage terminal GND of the transistor MN1. The circuit 10c also includes the resistance element R2 and the switch element SW1 which are provided in series between two input terminals of the operational amplifier A1. That is, the current detection circuit 10c includes the constituent element added into the current detection circuit 10a and the constituent element added into the current detection circuit 10b.

Even when the drain voltage of the transistor M1 is lower than the source voltage by the effect of the offset voltage, the current can flow from the source to the drain of the transistor MN1, and the current detection circuit 10c can perform current detection in consideration of the offset voltage. The current detection circuit 10c can suppress the settling time of the operational amplifier A1 after the transistor MN1 is switched to be turned ON/OFF, thereby realizing the high speed operation.

Embodiment 2

Figure 7:
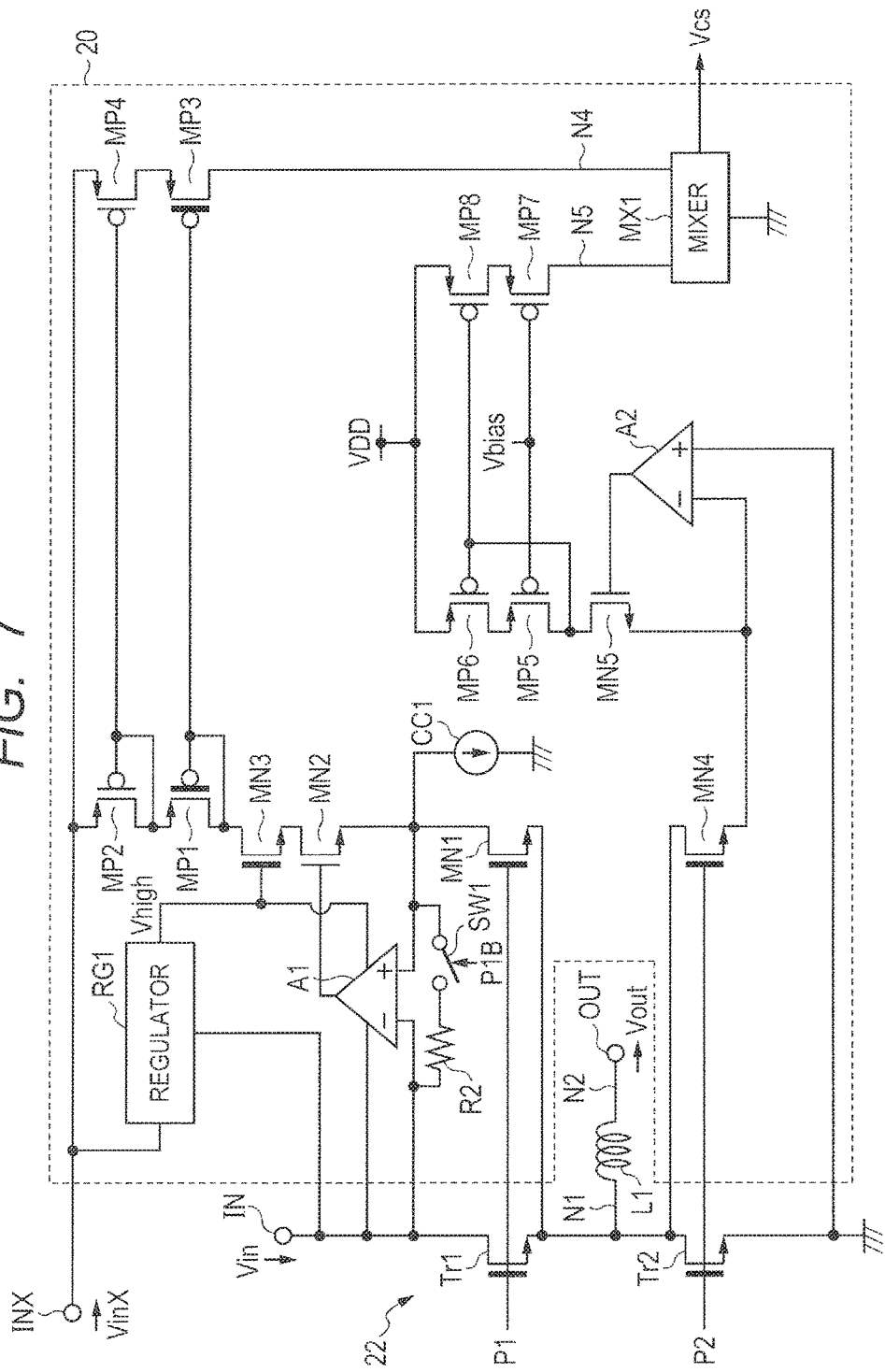
FIG. 7 is a diagram illustrating a configuration example of a current detection circuit according to an embodiment 2.

FIG. 7 is a diagram illustrating a configuration example of a current detection circuit 20 according to an embodiment 2. The current detection circuit 20 according to the embodiment 2 detects a current flowing through the transistor Tr1 provided on the high side of the drive circuit, and detects a current flowing through the transistor Tr2 provided on the low side of the drive circuit, thereby detecting the current flowing through the inductor L1. Specific descriptions will hereinafter be made.

As described in FIG. 7, the current detection circuit 20 includes transistors MN1 to MN5 and MP1 to MP8, operational amplifiers A1 and A2, a mixer MX1, a resistance element R2, a switch element SW1, a constant current source CC1, and a regulator RG1. FIG. 7 illustrates the transistors Tr1 and Tr2, and the inductor L1, as a part of the constituent elements provided in a drive circuit 22.

The drive circuit 22 is a circuit which drives an input voltage Vin, and outputs an output voltage rout, and provided at the output stage of a step-up/step-down DCDC converter which uses, for example, an average current mode control system. The configurations of the transistors Tr1 and Tr2 and the inductor L1 in the drive circuit 22 are the same as those of the transistors Tr1 and Tr2 and the inductor 11 in the drive circuit 12, and thus will not be described repeatedly over and over.

Of the circuit configuration of the current detection circuit 20, the configuration of the circuit detecting a current flowing through the transistor Tr1 provided on the high side of the drive circuit 22 is the same as the configuration of the current detection circuit 10c. Thus, of the circuit configuration of the current detection circuit 20, descriptions will hereinafter be made to the configuration of the circuit detecting a current flowing through the transistor Tr2 provided on the low side of the drive circuit 22.

In the current detection circuit 20, a transistor (a second sense transistor) MN4 is configured with a high withstand voltage N-channel NOS transistor, like the transistor Tr2. For example, the transistor size of the transistor MN4 is one thousandth of the transistor size of the transistor Tr2.

The transistor MN4 is provided over a current path (a second current path) between a source voltage terminal (hereinafter referred to as a source voltage terminal VDD) to which a source voltage VDD is supplied and the drain (a node N1) of the transistor Tr2. A pulse signal P2 is supplied to the gate of the transistor MN4.

The operational amplifier (the second operational amplifier) A2 amplifies a potential difference between a source voltage (that is, the ground voltage GND) of the transistor Tr2 and a source voltage of the transistor MN4. The operational amplifier A2 is configured with a low withstand voltage transistor.

The operational amplifier A2 amplifies the potential difference between the source voltage of the transistor Tr2 and the source voltage of the transistor MN4, instead of amplifying the potential difference between the drain voltage of the transistor Tr2 and the drain voltage of the transistor MN4. Even when the transistor Tr2 is switched to be turned ON/OFF at high speed, the operational amplifier A2 is not required to perform a high-speed operation, because the voltage supplied to the input terminal of the operational amplifier A2 is not quickly switched. As a result, the current detection circuit 20 does not use an expensive operational amplifier applicable to the high-speed operation, thereby enabling to suppress an increase in the manufacturing cost.

The output voltage of the operational amplifier A2 is supplied to the gate of the transistor (a second current control transistor) MN5. The transistor MN5 is configured with a low withstand voltage N-channel MOS transistor, and is provided in series with the transistor MN4 over the current path between the source voltage terminal VDD and the node N1. As a result, the source voltage of the transistor Tr2 is mirrored to the source voltage of the transistor MN4.

A gate-source voltage and a drain-source voltage of the transistor MN4 respectively indicate the same values as the gate-source voltage and the drain-source voltage of the transistor Tr2. Therefore, a current (in this example, a current of one thousandth) proportional to the current flowing between the drain and the source of the transistor Tr2 flows with high accuracy between the drain and the source of the transistor MN4.

The transistors MP5 and MP6 are configured both with a low withstand voltage P-channel MOS transistor, and are provided in series with the transistor MN5. The transistors MP7 and MP8 are configured both with a low withstand voltage P-channel MOS transistor, and are provided in series over a current path between the source voltage terminal VDD and the mixer MX1 as a current path different from that of the transistors MP5 and MP6. A bias voltage Vbias is supplied to the gates of the respective transistors MP5 and MP7. Further, the gate of the transistor MP8 is coupled to the gate of the transistor MP6 and the drain of the transistor MP5. Through the transistors MP7 and MP8, a current proportional to the current flowing through the transistors MP5 ad MP6 flows. That is, the transistors MP5 to MP8 are included in a current mirror circuit.

The mixer MX1 converts a current into a voltage, and outputs it as a detection result Vcs. This current has been obtained by mixing the current (the current of the node N4)

flowing through the transistors MP3 and MP4 and the current (the current of the node N5) flowing through the transistors MP7 and MP8.

(Concrete Configuration Example of Mixer MX1)

Figure 8:
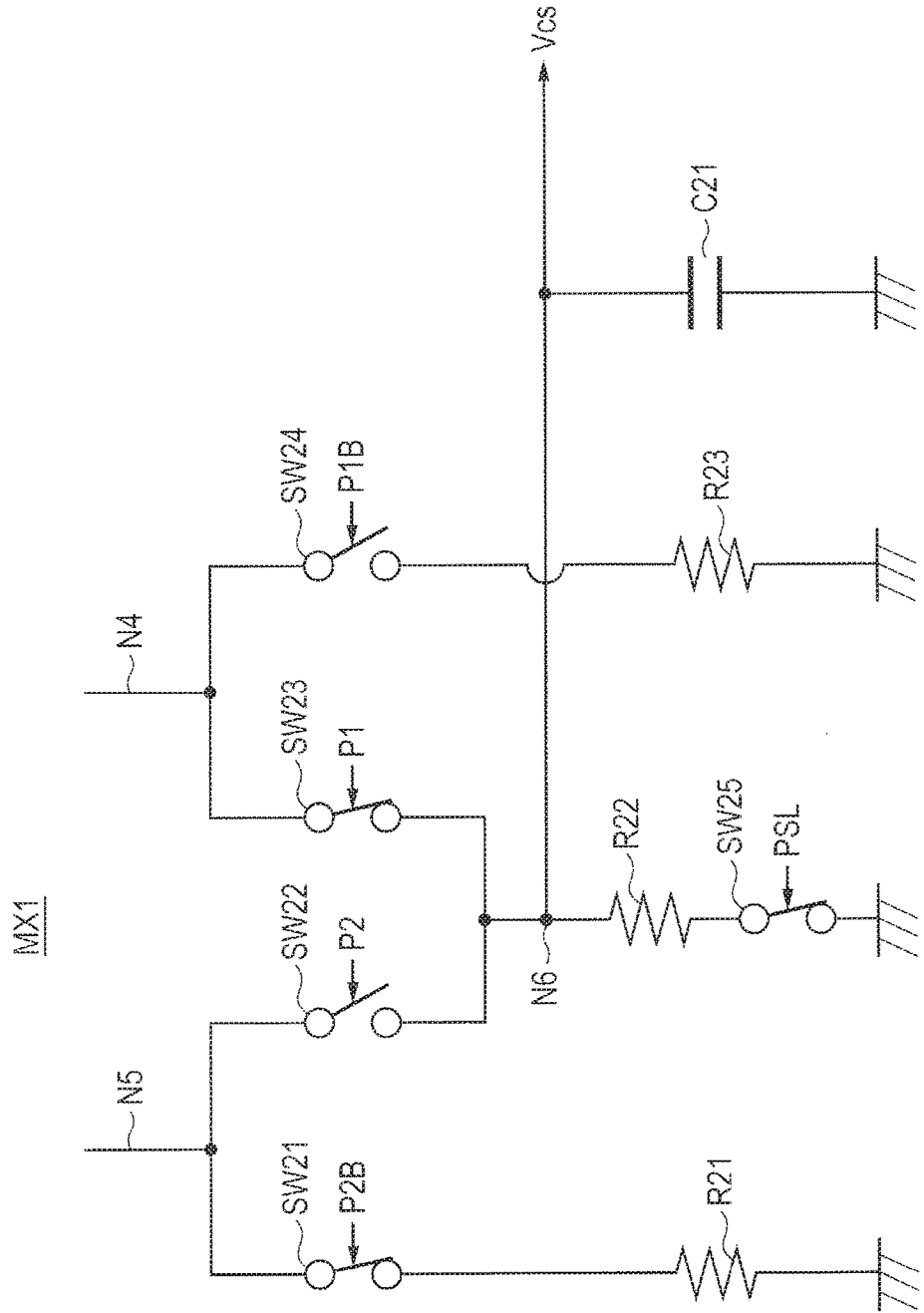
FIG. 8 is a diagram illustrating a concrete configuration of a mixer provided in the current detection circuit illustrated in FIG. 7.

FIG. 8 is a diagram illustrating a concrete configuration of the mixer MX1.

As illustrated in FIG. 8, the mixer MX1 includes switch elements SW21 to SW25, resistance elements R21 to R23, and a capacitance element C21. The resistance value of the resistance elements R21 to R23 indicates the same value.

The switch element SW21 and the resistance element R21 are provided in series between the drain (a node N5) and the ground voltage terminal GND of the transistor MP7. The switch element SW21 is controlled to be turned ON/OFF based on an inverted signal P2B of a pulse signal P2. The switch element SW22 is provided between the node N5 and the output terminal (a node N6) of the mixer MX1. The switch element SW22 is controlled to be turned ON/OFF based on the pulse signal P2. The switch element SW23 is provided between the node N4 and the node N6. The switch element SW23 is controlled to be turned ON/OFF based on the pulse signal P1. The resistance element R22 and the switch element SW25 are provided in series b en the node N6 and the ground voltage terminal GND. The switch element SW25 is controlled to be turned ON/OFF based on a pulse signal PSL. The switch element SW24 and the resistance element R23 are provided in series between the drain (the node N4) and the ground voltage terminal GND of the transistor MP3. The switch element SW24 is controlled to be turned. ON/OFF based on the inverted signal P1B of the pulse signal P1. The capacitance element C21 is provided between the node N6 and the ground voltage terminal GND.

Figure 9:
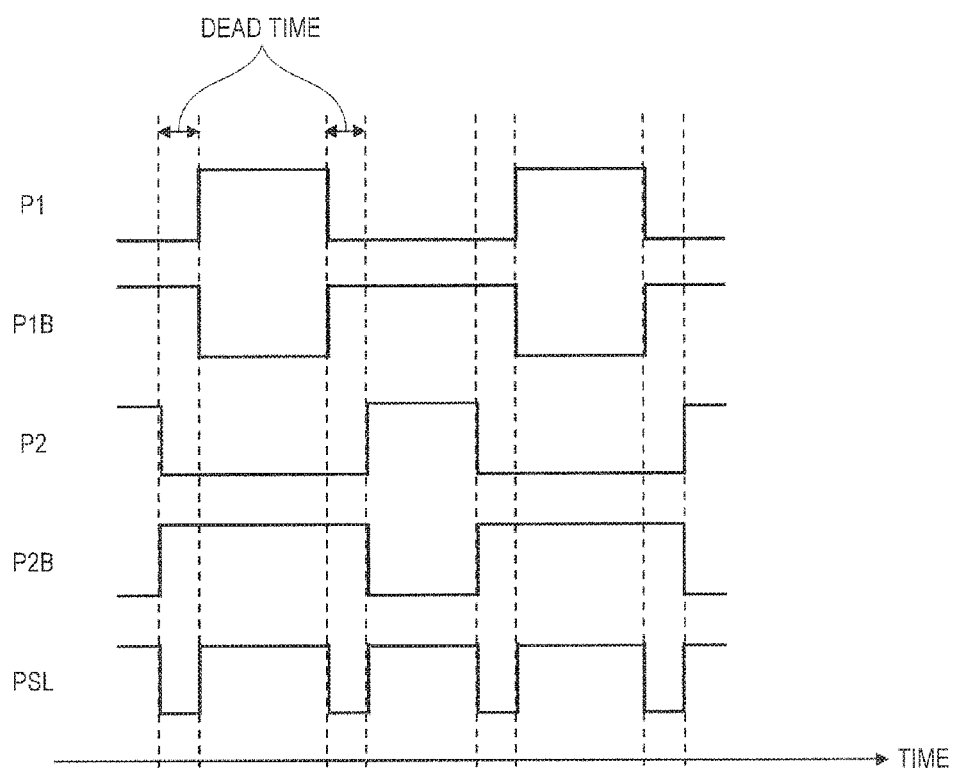
FIG. 9 is a timing chart illustrating an operation of the mixer illustrated in FIG. 8.

FIG. 9 is a timing chart illustrating a switching operation of the mixer MX1.

As illustrated in FIG. 9, the pulse signal P1 rises after the elapse of a predetermined period (referred to as a dead time), after the pulse signal P2 falls. Similarly, the pulse signal P2 rises after the elapse of the dead time, after the pulse signal P1 falls. This can prevent that the transistors Tr1 and Tr2 are instantaneously turned ON at the same time.

The pulse signals P1 and P2 are switched between the H level and the L level complementarily based on the dead time existing therebetween. The pulse signals P1B and P2B are inverted signals of the respective pulse signals P1 and P2. The pulse signal PSL indicates the L level during the dead time period, and indicates the H level during any other times.

For example, when the pulse signal P1 indicates the H level, and when the pulse signal P2 indicates the L level, a current flows through the transistor Tr1, and no current flows through the transistor Tr2. A current is supplied from the node N4 to the mixer MX1, and no current flows from the node N5 to the mixer MX1. In the mixer MX1, the switch elements SW21, SW23, and SW25 are turned ON, while switch elements SW22 and SW24 are turned OFF. The current supplied from the node N4 flows through the ground voltage terminal GND via the switch element SW23, the resistance element R22, and the switch element SW25. The voltage of the node N6 is output as a detection result Vcs. This voltage is generated based on a value of the current flowing from the node N4 to the resistance element R22 and a resistance value of the resistance element R22.

Because the switch element SW21 is ON, the resistance element R21 is coupled to the node N5 with no current flowing therethrough. Even when the switch element SW21 is turned OFF next time, and when the switch element SW22 is turned ON, it is possible to have a constant load of the node N5 by the resistance element.

For example, when the pulse signal P2 indicates the H level, and when the pulse signal P1 indicates the L level, a current flows through the transistor Tr2, and no current flows through the transistor Tr1. Thus, a current is supplied from the node N5 to the mixer MX1, and no current is supplied from the node N4 to the mixer MX1. In this case, in the mixer MX1, the switch elements SW22, SW24, and the SW25 are turned ON, while the switch elements SW21 and SW23 are OFF. As a result, a current supplied from the node N5 flows through the ground voltage terminal GND through the switch element SW22, the resistance element R22, and the switch element SW25. Then, a voltage of the node N6 is output as a detection result Vcs. This voltage is generated based on a value of the current flowing through the resistance element R22 from the node N5 and a resistance value of the resistance element R22.

Because the switch element SW24 is turned ON, the resistance element SW23 is coupled to the node N4 through which no current flows. Even when the switch element. SW24 is turned OFF next time, and when the switch element. SW23 is turned ON, it is possible to have a constant load of the node N4 by the resistance element.

In this manner, in the current detection circuit 20 according to this embodiment, like the case of the current detection circuit 10, the operational amplifier A1 amplifies a potential difference between the drain voltage of the transistor Tr1 and the drain voltage of the transistor MN1. As a result, even when the transistor Tr1 is switched between ON/OFF states quickly, the voltage to be supplied to the input terminal of the operational amplifier A1 is not quickly switched. Thus, the operational amplifier A1 is not required to perform a high-speed operation. In the current detection circuit 20 according to this embodiment, the operational amplifier A2 amplifies the potential difference between the source voltage of the transistor Tr2 and the source voltage of the transistor MN4. Thus, even when the transistor Tr2 is switched between ON/OFF states quickly, the operational amplifier A2 is not required to perform a high speed operation, because the voltage supplied to the input terminal of the operational amplifier A2 is not quickly switched. Thus, the current detection circuit. 20 does not need to use the expensive operational amplifier for the operational amplifiers A1 and A2, thereby enabling to suppress the increase in the manufacturing cost.

In the current detection circuit 20 according to this embodiment, like the current detection circuit 10, it is adjusted that a potential difference between a high potential side source voltage (a voltage Vhigh) and a low potential side source voltage (an input voltage Vin) supplied to the operational amplifier A1 becomes equal to or lower than a withstand voltage of each transistor included in this operational amplifier A1. Thus, the operational amplifier A1 may be configured not only with a high withstand voltage transistor, but also with a low withstand voltage transistor. As a result, it is possible to improve the accuracy or the operational speed of the operational amplifier A1. The operational amplifier A2 is configured with the low withstand voltage transistor, thereby enabling to perform the high speed operation with high accuracy.

In this embodiment, the descriptions have been made to the example in which the configuration of the circuit detecting the current flowing through the transistor Tr1 in the circuit configuration of the current detection circuit 20 is the same as the configuration of the current detection circuit 10c. However, it is not limited to this example. The configuration of the circuit detecting the current flowing through the transistor Tr1 in the circuit configuration of the current detection circuit 20 may be the same as the configuration of any of the current detection circuits 10, 10a, and 10b.

(Application Example of Current Detection Circuit 20)

Figure 10:
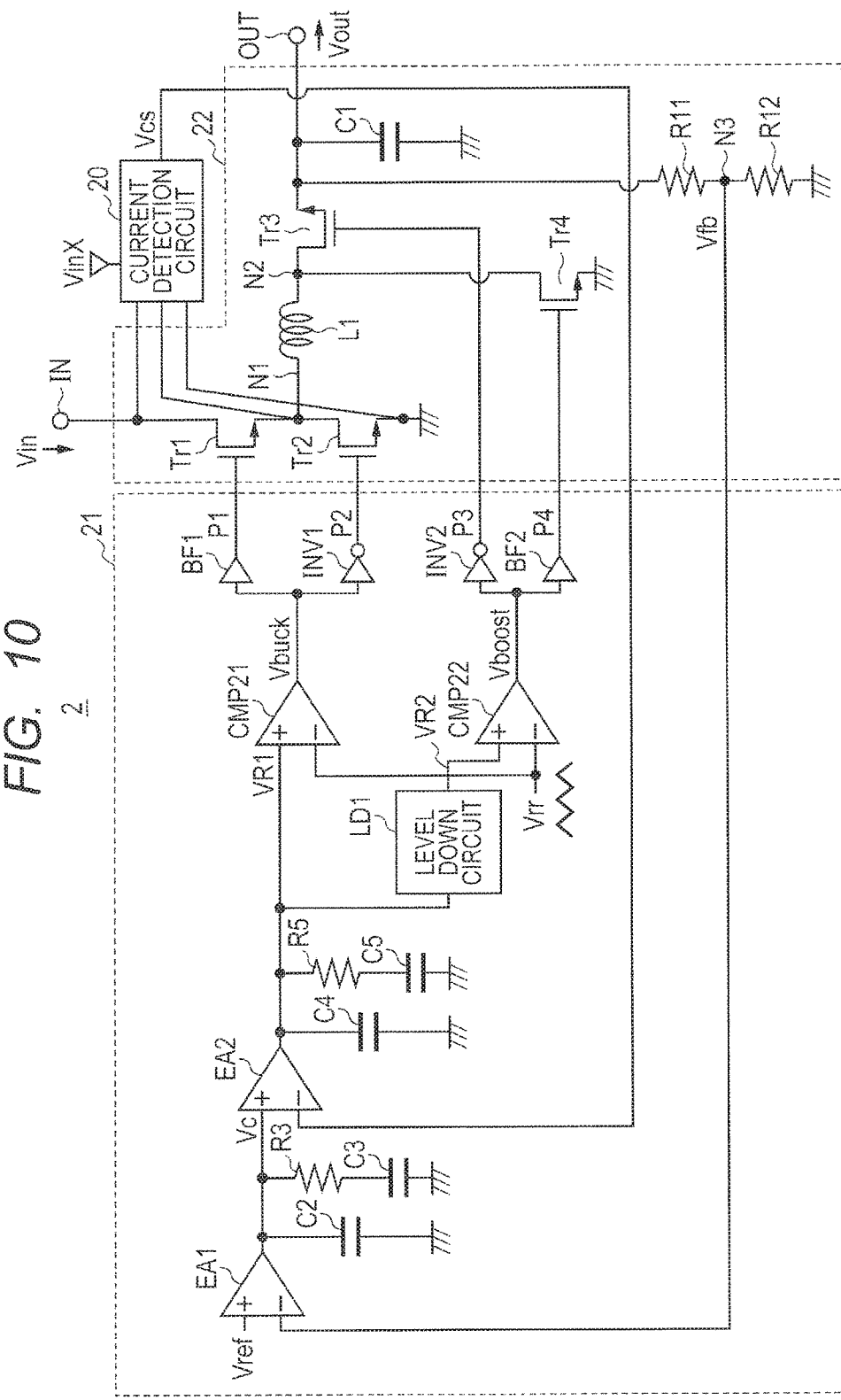
FIG. 10 is a diagram illustrating a configuration example of a DCDC converter over which the current detection circuit illustrated in FIG. 7 is mounted.
Figure 11:
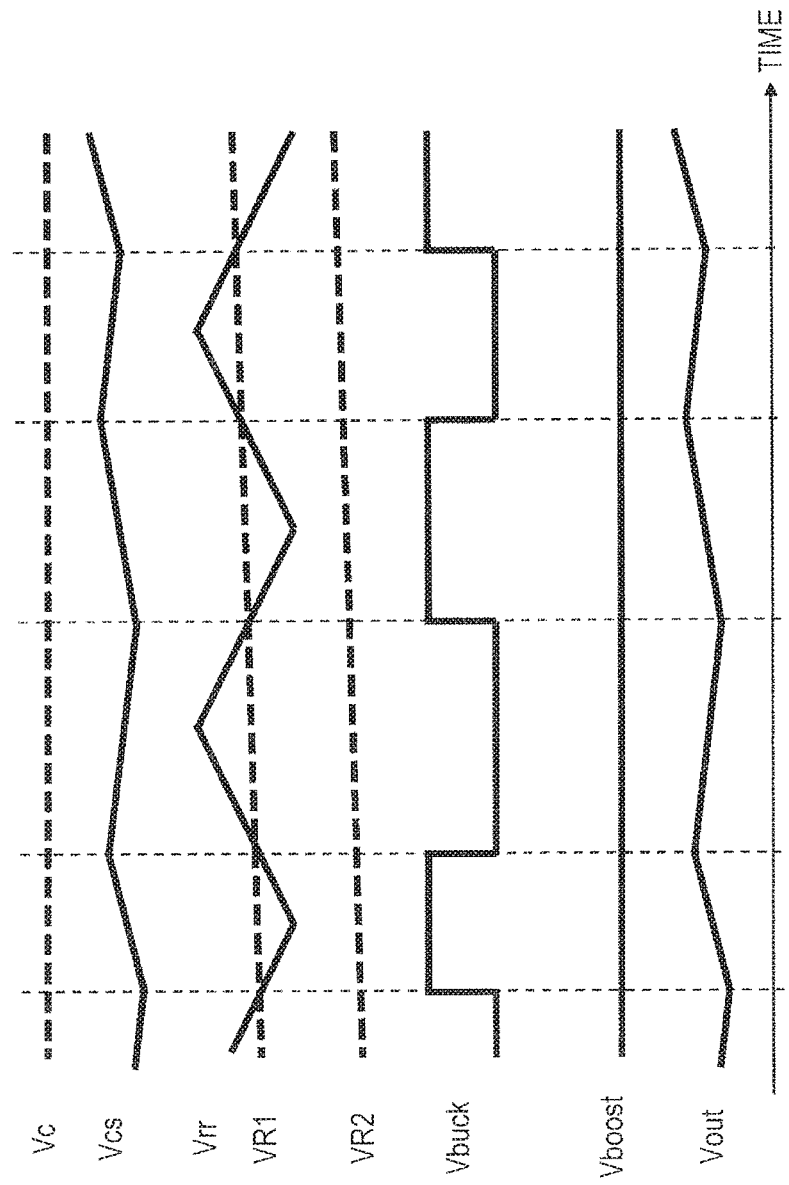
FIG. 11 is a timing chart illustrating an operation of the DCDC converter illustrated in FIG. 10.

FIG. 10 is a diagram illustrating a configuration example of a step-up/step-down DCDC converter 2 in which the current detection circuit 20 is mounted. FIG. 11 is a timing chart illustrating an operation of the DCDC converter 2. The DCDC converter 2 uses an average current mode control system as one control system for the output voltage.

As illustrated in FIG. 10, the DCDC converter 2 includes the current detection circuit 20, the drive circuit 22, and a control unit 21. The drive circuit 22 includes transistors Tr1 to Tr4, the inductor L1, the capacitance element C1, and the resistance elements R11 and R12. The control unit 21 has error amplifiers EA1 and EA2, capacitance elements C2 to C5, resistance elements R3 and R5, a level-down circuit LD1, comparator CMP 21 and CMP 22, buffers BF1 and BF2, and inverters INV1 and INV2.

In the drive circuit 22, the transistor (a third drive transistor) Tr3 is provided between the other end (the node N2) and the output terminal OUT of the inductor L1, and a pulse signal P3 is supplied to its gate from the control unit 21. The transistor Tr4 (a fourth drive transistor) is provided between the other end and the ground voltage terminal GND of the inductor L1, and a pulse signal P4 is supplied to its gate from the control unit 21. Any other configurations of the drive circuit 22 are the same as those of the drive circuit 12, and thus will not be described repeatedly over and over.

In the step-down operation of the drive circuit 22, the transistor Tr3 is fixed in the ON state, and the transistor Tr4 is fixed in the OFF state. Then, the transistors Tr1 and Tr2 are controlled between ON/OFF states complementarily based on the dead time existing therebetween.

In the step-down operation of the drive circuit 22, the transistor Tr1 is turned ON, and the transistor Tr2 is turned OFF, thereby causing a current to flow from the input terminal IN to the output terminal OUT through the transistor Tr1 and the inductor L1. At this time, the inductor L1 is charged with current energy. After this, the transistor Tr1 is turned OFF, and the transistor Tr2 is turned ON, thereby cutting off the current flowing from, the input terminal IN to the inductor L1 through the transistor Tr1. To maintain the current value of the previously flowing current, the inductor L1 discharges the charged current energy toward the output terminal OUT. As a result, a current flows from the ground voltage terminal GND toward the output terminal OUT through the transistor Tr2. By repeating this operation, the drive circuit 22 outputs an output voltage Vout which is obtained by stepping down the input voltage yin by a certain level corresponding to a duty ratio of pulse signals P1 and P2.

In the step-up operation of the drive circuit 22, the transistor Tr1 is fixed in the ON state, and the transistor Tr2 is fixed in the OFF state. Then, the transistors Tr3 and Tr4 are controlled complementarily based on the dead time existing therebetween.

In the step-up operation of the drive circuit 22, first, the transistor Tr4 is turned ON, and the transistor Tr3 is turned OFF, thereby causing a current to flow from the input terminal IN to the ground voltage terminal GM) through the inductor L1 and the transistor Tr4. At this time, the inductor L1 is charged with current energy. After this, the transistor Tr4 is turned OFF, and the transistor Tr3 is turned ON, thereby cutting off the current flowing from the inductor L1 to the ground voltage terminal GND through the transistor Tr4. To maintain the current value of the previously flowing current, the inductor L1 discharges the charged current energy toward the output terminal OUT. By repeating this operation, the drive circuit 22 outputs an output voltage Vout which is obtained by stepping up the input voltage Vin by a certain level corresponding to a duty ratio of pulse signals P3 and P4.

Further, in the step-up/step-down operation of the drive circuit 22, the above-described step-up operation and the step-down operation are performed in combination with each other.

As described above, the current detection circuit 20 detects the current flowing through the transistor Tr1 provided on the high side of the drive circuit 22, and detects the current flowing through the transistor Tr2 provided on the low side of the drive circuit 22, thereby detecting the current flowing through the inductor L1 and outputting a detection result Vcs. This detection result Vcs is fed back to the control unit 21.

In the control unit 21, the error amplifier EA1 amplifies a potential difference between the reference voltage Vref and the voltage Vfb fed back from the drive circuit 22, to generate a voltage Vc. The voltage Vc is integrated by the capacitance element C2 provided between the output terminal and the ground voltage terminal. GND of the error amplifier EA1, and the capacitance element C3 and the resistance element R3 provided in series between the output terminal and the ground voltage terminal GND of the error amplifier EA1.

For example, when the output voltage Vout decreases, and when the voltage Vfb is lower than the reference voltage Vref, the output voltage Vc of the error amplifier EA1 increases at the rate proportional to the potential difference between the voltage Vfb and the reference Vref. On the contrary, when the output voltage Vout increases, and when the output voltage Vfb is higher than the reference voltage Vref, the output voltage Vc of the error amplifier EA1 decreases at the rate proportional to the potential difference between the voltage Vfb and the reference voltage Vref. In the example of FIG. 11, the potential difference between the output voltage Vout and the reference voltage Vref is small. Thus, the output voltage Vc of the error amplifier EA1 indicates a constant value.

The error amplifier EA2 amplifies a potential difference between an output voltage (a reference voltage for the error amplifier EA2) of the error amplifier EA1 and a detection result Vcs of the current detection circuit. 20, to generate a voltage VR1. The voltage VR1 is integrated by the capacitance element C4 provided between the output terminal and the ground voltage terminal GND of the error amplifier EA2 or by the capacitance element C5 and the resistance element R5 which are provided. In series between the output terminal and the ground voltage terminal GND of the error amplifier EA2.

For example, when the current flowing through the inductor L1 decreases, and when the detection result Vcs is lower than the voltage Vc, the output voltage VR1 of the error amplifier EA2 increases at the rate proportional to the potential difference between the detection result Vcs and the voltage Vc. On the contrary, when the current flowing through the inductor L1 increases, and when the detection result Vcs is higher than the voltage Vc, the output voltage VR1 of the error amplifier EA2 decreases at the rate proportional to the potential difference between the detection result Vcs and the voltage Vs. In the example of FIG. 11, the output voltage VR1 of the error amplifier EA2 gradually increases while reducing the increasing rate, in accordance with the gradual increase of the detection result Vcs.

The level down circuit LD1 reduces the voltage VR1 by a predetermined voltage, and outputs it as a voltage VR1.

The comparator CMP21 compares the voltage VR1 and a triangular wave Vrr, and outputs a comparison result Vbuck. The buffer BF1 outputs the comparison result Vbuck as is as a pulse signal P1. The inverter INV1 inverts the comparison result Vbuck and outputs it as a pulse signal P2.

The comparator CMP22 compares the voltage VR2 and the triangular wave Vrr, and outputs it as a comparison result Vbuck. The inverter INV2 inverts the comparison result Vboost, and outputs it as a pulse signal P3. The buffer BF2 outputs the comparison result Vboost as is as a pulse signal P4.

With reference to FIG. 11, when the transistor Tr1 is turned ON, and also when the transistor Tr2 is turned. OFF, the current flowing through the inductor L1 increases, thus increasing the detection result Vcs of the current detection circuit 20. On the contrary, when the transistor Tr2 is turned ON, and when the transistor Tr1 is OFF, the current flowing through the inductor L1 decreases, the detection result Vcs of the current detection circuit 20 decreases. This detection result Vcs gradually increases totally while repeating the increase and the decrease. In accordance with it, the output voltage VR and the voltage VR2 of the error amplifier EA2 gradually increase while reducing the increasing rate.

In the example of FIG. 11, the triangular wave Vrr goes up and down around the voltage VR1, and always indicates a value higher than the voltage VR2. The comparison result Vbuck of the comparator CMP21 is repeatedly switched between the H level and the L level, while the comparison result Vboost of the comparator CMP22 is fixed in the L level. That is, in the example of FIG. 11, the step-up operation is not performed, but only the step-down operation is performed.

For example, when the voltage VR1 is higher than the triangular Vrr, the comparator CMP21 outputs the comparison result. Vbuck with the H level. Thus, the transistor Tr1 is turned ON, and the transistor Tr2 is turned OFF. Then, because the current flowing through the inductor L1 increases, the potential of the detection result Vcs increases in proportion to the elapse of the time in which the current flows. On the contrary, when the voltage VR1 is equal to or lower than the triangular wave Vrr, the comparator CMP21 outputs the comparison result Vbuck with the L level. Thus, the transistor Tr1 is turned OFF, and the transistor Tr2 is turned ON. Then, the current flowing through the inductor L1 decreases, thereby decreasing the potential of the detection result Vcs proportional to the elapse of the time in which this current flows. By repeating this operation, the DCDC converter 2 steps down (or steps up) the input voltage Vin to a predetermined level, and outputs it as an output voltage Vout.

This DCDC converter 2 is mounted, for example, over the vehicles. In recent years, the DCDC converter mounted over the vehicle is required to perform a high speed switching operation. Thus, it is effective to apply the current detection circuit 20 without being effected by the high speed switching operation. Further, the current detection circuit 20 can realize the operation with high accuracy by using the operational amplifiers A1 and A2 configured with a low withstand transistor. In this case, it is possible to design the DCDC converter 2 on the assumption that the accuracy variation is small. The DCDC converter 2 can increase the loop band.

Subsequently, descriptions will hereinafter be made to some modifications of the current detection circuit 20.

(First Modification of Current Detection Circuit 20)

Figure 12:
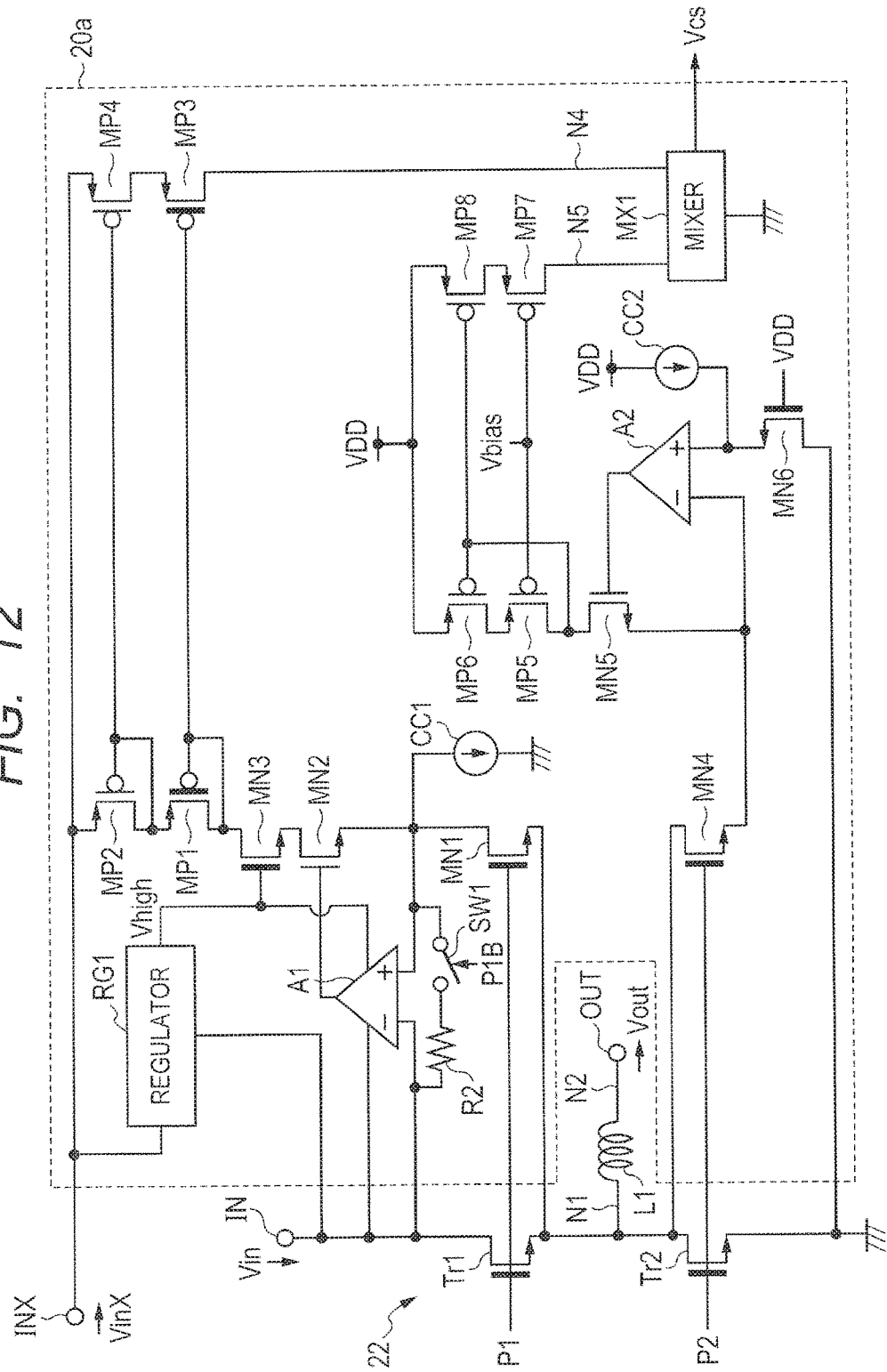
FIG. 12 is a diagram illustrating a first modification of the current detection circuit illustrated in FIG. 7.

FIG. 12 is a diagram illustrating a first modification of the current detection circuit 20 as a current detection circuit 20a.

In the current detection circuit 20a illustrated in FIG. 12, as compared with the current detection circuit 20 illustrated in FIG. 10, there is further provided a voltage supply unit for supplying a voltage higher than the ground voltage GND to one input terminal coupled to the ground voltage terminal GND, of two input terminals of the operational amplifier A2.

The voltage supply unit has a transistor MN6 and a constant current source (a second constant current source) CC2.

The transistor MN6 is configured with the high withstand voltage N-channel MOS transistor having the same size as, for example, the transistor MN4. The transistor MN6 is provided between one input terminal (non-inverted input terminal) of the operational amplifier A2 and the ground voltage terminal GND, and a source voltage VDD is supplied to its gate, thereby always being in the ON state. That is, the transistor MN6 functions as a resistance element (a second resistance element).

The constant current source CC2 is provided between the source voltage terminal VDD and one input terminal of the operational amplifier A2, and supplies a constant current to the one input terminal of the operational amplifier A2. As a result, a voltage which is higher by a predetermined voltage than the ground voltage GND is supplied to the one input terminal of the operational amplifier A2. Any other configurations of the current detection circuit 20a are the same as those of the current detection circuit 20, and thus will not be described repeatedly over and over.

The source voltage of the transistor MN4 may and should originally be lower than the drain voltage, by the effect of the offset voltage of the operational amplifier A2. However, if the voltage supply unit is not provided, the voltage of the other input terminal (inverted input terminal) of the operational amplifier A2 cannot be a minus voltage lower than the ground voltage GND supplied to the one input terminal (non inverted input terminal). Thus, the source voltage of the transistor MN4 will not be lower than assumed. As a result, it is not possible to perform current detection in consideration of the effect of the offset voltage.

On the contrary, the current detection circuit 20a supplies a voltage higher than the ground voltage GND to the one input terminal of the operational amplifier A2 using the voltage supply unit. As a result, in the current detection circuit 20a, the source voltage of the transistor MN4 can be lower than the drain voltage as assumed, by the effect of the offset voltage, thus enabling to perform current detection in consideration of the offset voltage.

(Second Modification of Current Detection Circuit 20)

Figure 13:
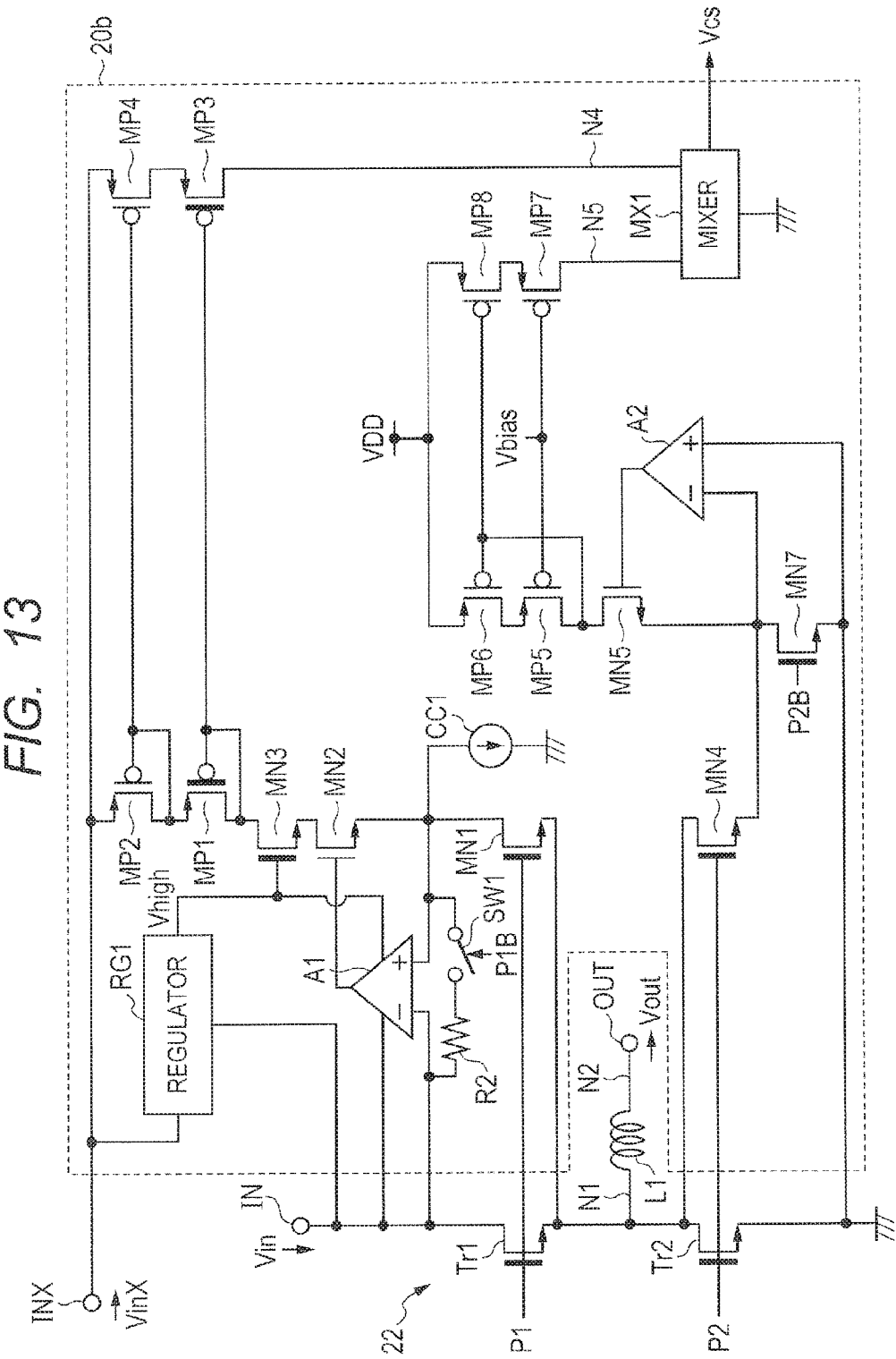
FIG. 13 is a diagram illustrating a second modification of the current detection circuit illustrated in FIG. 7.

FIG. 13 is a diagram illustrating a second modification of the current detection circuit 20 as a current detection circuit 20b.

As compared with the current detection circuit 20 illustrated in FIG. 7, the current detection circuit 20b illustrated in FIG. 13 further includes a transistor (a switch transistor) MN7.

The transistor MN7 is configured with a high withstand voltage N-channel MOS transistor having the same size as, for example, the transistor MN4. The transistor MN7 is provided between the two input terminals of the operational amplifier A2. The transistor MN7 is controlled to be turned ON/OFF based on the inverted signal P2B of the pulse signal P2. That is, the transistor MN7 is controlled to be turned ON/OFF complementarily with the transistors Tr2 and MN4. The resistance value at the time the transistor MN7 is turned ON indicates the same resistance value at the time the transistor MN4 is turned ON. Any other configurations of the current detection circuit 20b are the same as those of the current detection circuit 20, and thus will not be described repeatedly over and over.

Even if the transistor MN4 is turned OFF, the transistor MN7 is turned ON. Thus, the load of the operational amplifier A2 by the resistance element is constantly maintained. As a result, the current detection circuit 20b can suppress the settling time of the operational amplifier A2 after the transistor MN4 is switched between ON/OFF states, thereby realizing the high-speed operation.

(Third Embodiment of Current Detection Circuit 20)

Figure 14:
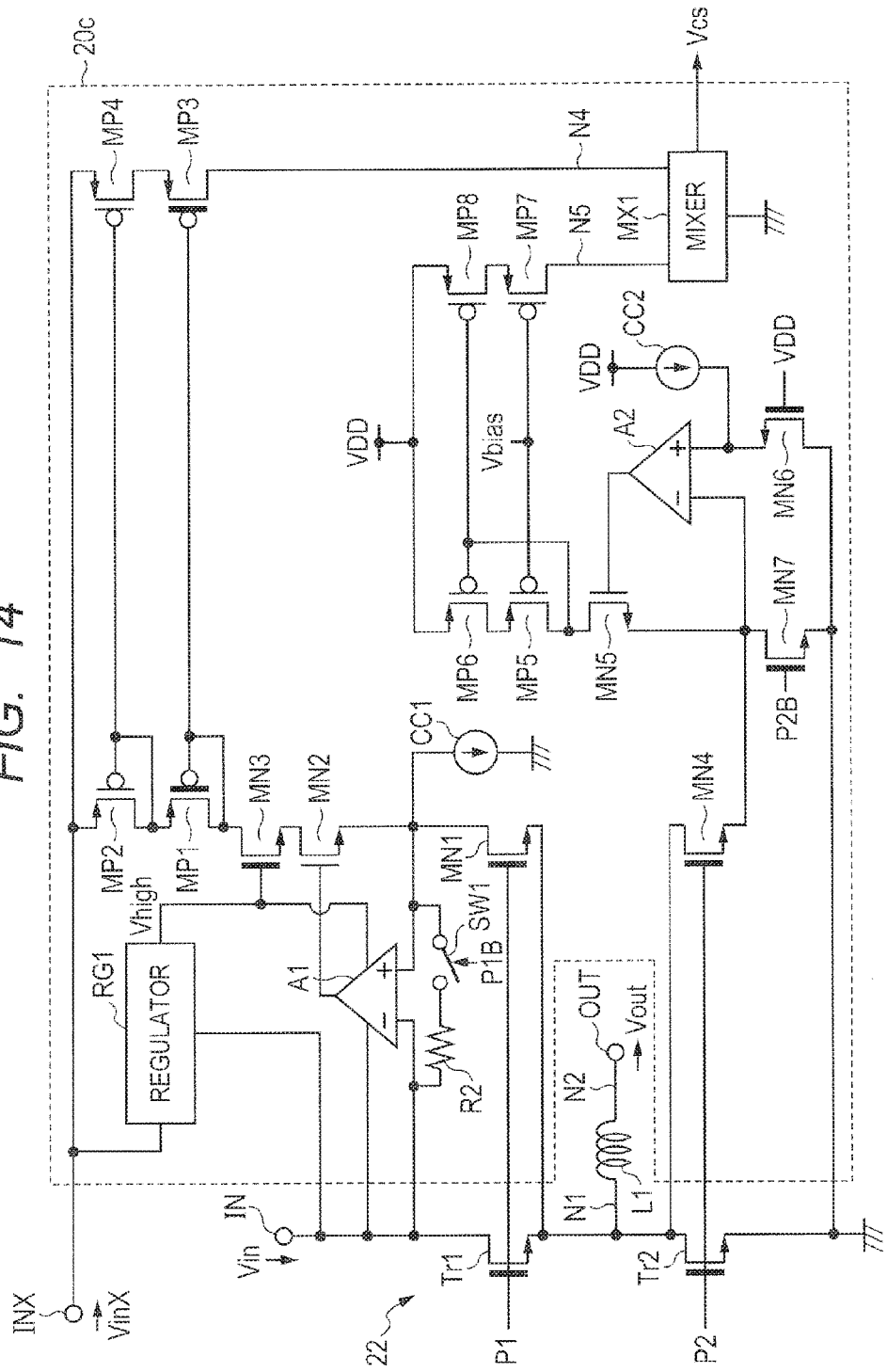
FIG. 14 is a diagram illustrating a third modification of the current detection circuit illustrated in FIG. 7.

FIG. 14 is a diagram illustrating a third modification of the current detection circuit 20 as a current detection circuit 20c.

As compared with the current detection circuit 20 illustrated in FIG. 7, the current detection circuit 20c illustrated in FIG. 14 further includes a voltage supply unit for supplying a voltage higher than the ground voltage GNU to one input terminal of the operational amplifier A2, and also includes the transistor MN7 provided between the two input terminals of the operational amplifier A2. That is, the current detection circuit 20c includes the constituent element added into the current detection circuit 20a and the constituent element added into the current detection circuit 20b.

As a result, in the current detection circuit 20c, the source voltage of the transistor MN4 can be lower than the drain voltage as assumed by the effect of the offset voltage, thus enabling to perform current detection in consideration of the offset voltage. The current detection circuit 20c can suppress the settling time of the operational amplifier A2 after the transistor MN4 is switched between ON/OFF states, thereby realizing the high speed operation.

Embodiment 3

In this embodiment, descriptions will now be made to another application example of the current detection circuit 20.

Figure 15:
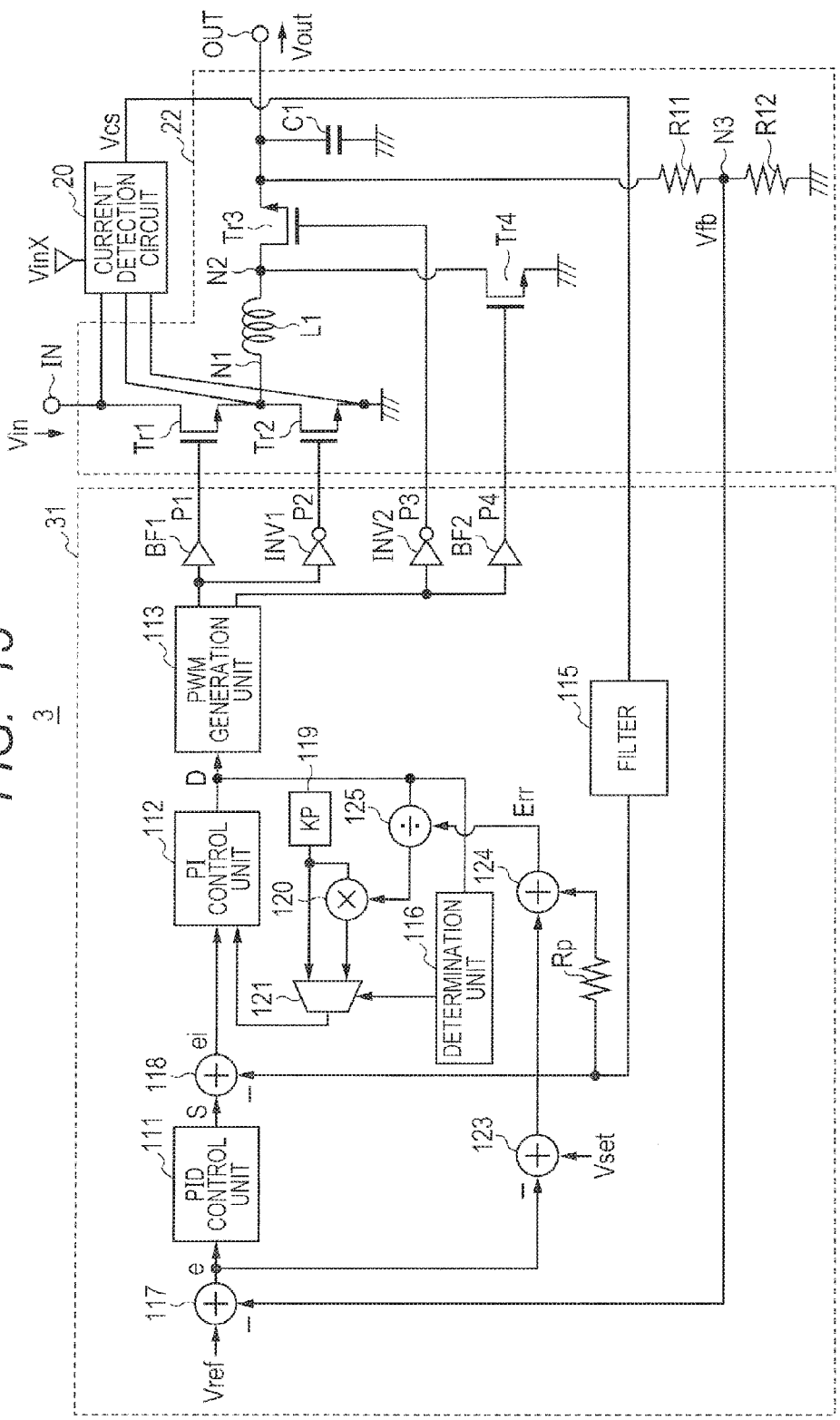
FIG. 15 is a diagram illustrating a configuration example of a DCDC converter according to an embodiment 3.

FIG. 15 is a diagram illustrating a configuration example of a step-up/step-down DCDC converter 3 on which the current detection circuit 20 is mounted.

As illustrated in FIG. 15, the DCDC converter 3 includes the current detection circuit 20, the drive circuit 22, and a control unit 31. The current detection circuit 20 and the drive circuit 22 have already been described. The control unit 31 will hereinafter be described.

The control unit 31 includes a PID control unit 111, a PI control unit 112, a PWM generation unit 113, a filter 115, a step-up/step-down determination unit (a determination unit) 116, subtracters 117 and 118, a memory unit 119, a multiplier 120, a selection circuit 121, a resistance element 122, a subtracter 123, an adder 124, a divider 125, buffers BF1 and BF2, and inverters INV1 and INV2.

The subtracter 117 outputs a difference between a reference voltage Vref and a voltage Vfb fed back from the drive circuit 22, as a difference signal e.

The PID control unit 111 is a circuit for feedback controlling an output voltage Vout, performs PID control (proportional control, integral control, differential control) for the difference signal e output from the subtracter 117, and outputs it as a control signal S.

In the PID control unit 111, the proportional control, the integral control, and the differential control for the difference signal e are performed based on the following equations (1) and (2). In this case, "KP" represents a reference proportional constant, "KI" represents an integral constant, "KD" represents a differential constant, and "t" represents the time.

Proportional control: $KP*e(t)$ (1)

Integral control: $KI*\int e(t)dt$ (2)

Differential control: $KD*d/dt \cdot e(t)$ (3)

The PID control unit 111 adds a result of adding the proportional control, the integral control, and the differential control for the difference signal e, and outputs it as a control signal S.

The filter 115 removes a noise component of the detection result Vcs of the current detection circuit 20.

The subtracter 118 outputs a difference between the control signal S output from the PID control unit 111 and a result of filtering the detection result Vcs of the current detection circuit 20 by the filter 115, as a difference signal ei.

The PI control unit 112 is a circuit for feedback controlling the average current flowing through the inductor L1, performs PI control (proportional control and integral control) for the difference signal ei output from the subtracter 118, and outputs it as a control signal C.

At the time of voltage step down, that is, at the time when the input voltage Vin the output voltage Vout, the average current flowing through the inductor L1 is proportional to the input voltage Vin. Therefore, if no countermeasure is made, the current loop band for feedback controlling the current flowing through the inductor L1 will be proportional to the input voltage. As a result, it is difficult that the band of the current loop is widened.

In consideration of the above, the present inventors have focused on that the control signal D is inversely proportional to the input voltage Vin during the voltage step down. They have adopted a configuration, during the voltage step down, for proportionally controlling the difference signal ei using a proportional constant which has been obtained by multiplying the reference proportional constant KP by the control signal D and dividing it by an error component Err. As a result, in the DCDC converter 3, during the voltage step down, the input voltage dependency of the current loop band is offset. Thus, it is possible to generate a stable output voltage Vout, without depending on the level of the input voltage Vin. Note, during the voltage step up, the current loop band has no input voltage dependency.

Specifically, the step-up/step-down determination unit 116 determines whether the drive circuit 22 is now in the process of stepping up or stepping down a voltage, based on the control signal C output from the PI control unit 112. The divider 125 outputs a result D/Err which has been obtained by dividing the control signal D by the error component Err. The error component Err is an added result by the adder 124. This added result is obtained by adding a difference (Vset-e) and a voltage (Iout*Rp). This difference is a difference between a difference signal e calculated by the subtracter 123 and a target voltage Vset of the output voltage gout. The voltage is generated by a current Iout, flowing through the inductor L1 and obtained based on the detection result Vcs, and a parasitic resistance Rp of the drive line.

The multiplier 120 outputs a multiplied result KP*D/Err which has been obtained by multiplying the output D/Err of the divider 125 and a reference proportional constant KP stored in the memory unit 119. The selection circuit 121 selects and outputs either one of the reference proportional constant KP and the multiplied result KP*D/Err, based on the determination result of the step-up/step-down determination unit 116. For example, when the step-up/step-down determination unit 116 determines that it is in the process of stepping up a voltage (or stepping-up/stepping down), the selection circuit 121 selects and outputs the reference proportional constant KP. On the contrary, when the step-up/step-down determination unit 116 determines that it is in the process of stepping down the voltage, the selection circuit 121 selects and outputs the multiplied result KP*D/Err.

The output result of the selection circuit 121 is used as a proportional constant in the proportional control of the PI control unit 112. That is, the P1 control unit 112 performs proportional control for the difference signal ei using the reference proportional constant KP as a proportional constant, during the voltage step up, and performs proportional control for the difference signal ei using the multiplied result KP*C/Err as a proportional constant, during voltage step down.

In the PI control unit 112, the proportional control and the integral control for the difference signal ei are performed respectively based on the following equations (4) and (5).

Proportional control (during voltage step up): $KP*ei$
(t) (during voltage step down): $KP*D/Err*ei(t)$ (4)

Integral control: $KI*\int ei(t)dt$ (5)

The PI control unit 112 adds results of the proportional control and the integral control for the difference signal ei, and then outputs the addition result as a control signal D.

The PWM generation unit 113 generates pulse signals Vbuck and Vboost of the duty ratio of the control signal D. The buffer BF1 outputs the pulse signal Vbuck as is as a pulse signal P1. The inverter INV1 inverts the pulse signal Vbuck, and outputs it as a pulse signal P2. The inverter INV2 inverts the pulse signal Vboost, and outputs it as a pulse signal P3.

In this manner, the DCDC converter 3 according to this embodiment proportionally controls the difference signal ei (a current loop) using a proportional constant, during the voltage step down. This proportional constant has been obtained by multiplying the control signal D inversely proportional to the input voltage Vin and the error component Err. As a result, the DCDC converter 3 can offset the input voltage dependency of the current loop band, during the voltage step down, thereby enabling to widening the band of the current loop entirely over the input power. It is possible to realize widening of the band of the current loop for feedback controlling the output voltage Vout, together with the widening of the band of the current loop. As a result, the DCDC converter 3 can generate the stable output voltage Vout without depending on the input voltage Vin. In other words, it is possible to improve the Line Transient characteristic and the Load Transient characteristic.

In this embodiment, though the descriptions have so far been made to the case in which the DCDC converter 3 is a step-up/step-down converter. However, it is not limited to this type, and it may simply have a function for at least stepping up the voltage.

The PID control unit 111 may be replaced by a PI control unit which performs only the proportional control and the integral control.

The PI control unit 112 may be replaced by a PID control unit which performs the differential control, in addition to the proportional control and the integral control.

Further, during the voltage step down, the PI control unit 112 may perform not only proportional control using the proportional constant multiplied by D/Err, but also perform the integral control using the integral constant multiplied by D/Err. Further, when the PI control unit 112 is replaced by the PID control unit, during the voltage step down, the differential control may be performed using the differential constant multiplied by D/Err.

As described above, in the current detection circuits 10 and 20 according to the above-described embodiments 1 to 3, the operational amplifier A1 amplifies the potential difference between the drain voltage of the transistor Tr1 and the drain voltage of the transistor MN1, instead of amplifying the potential difference between the source voltage of the transistor Tr1 and the source voltage of the transistor MN1. As a result, even when the transistor Tr1 is switched quickly between the ON/OFF states, the voltage supplied to the input terminal of the operational amplifier A1 is not quickly switched. Thus, the operational amplifier A1 is not required to perform the high speed operation. Therefore, the current detection circuits 10 and 20 according to the above-described embodiments 1 to 3 do not need to use the expensive operational amplifier for the operational amplifier A1, thereby enabling to suppress an increase in the manufacturing cost.

In the current detection circuits 10 and 20 according to the above-described embodiments 1 to 3, it is adjusted that the potential difference between the high potential side source voltage (a voltage VThigh) and the low potential side source voltage (an input voltage Vin) supplied to the operational amplifier A1 becomes equal to or lower than a withstand voltage of each transistor included in the operational amplifier A1. Thus, it is not limited that the operational amplifier A1 is configured with the high withstand voltage transistor, and may be configured with a low withstand voltage transistor. Thus, it is possible to improve the accuracy or the operational speed of the operational amplifier A1.

Further, in the current detection circuit 20 according to the above-described embodiments 2 and 3, the operational amplifier A2 amplifies the potential difference between the source voltage of the transistor Tr2 and the source voltage of the transistor MN4. Even when the transistor Tr2 is quickly switched between the ON/OFF states, the voltage supplied to the input terminal of the operational amplifier A2 is not quickly switched. Thus, the operational amplifier A2 is not required to perform the high speed operation. As a result, the current detection circuit 20 according to the above-described embodiments 2 and 3 does not need to use the expensive operational amplifier for the operational amplifier A2, thereby enabling to suppress the increase in the manufacturing cost.

In the above-described embodiments 1 to 3, the descriptions have been made to the case in which the current detection circuit is mounted over the DCDC converter. However, it is not limited to this example. For example, the circuit may be mounted over the solenoid driver or the motor control device.

Accordingly, the inventions made by the present inventors have specifically been described based on the preferred embodiments. The present invention is not limited to the above-described embodiments. Various changes may be made without departing from the scope thereof.

For example, in the configuration of the semiconductor memory device according to the above-described embodiments, it is possible to invert the conductive type (p-type or n-type) of the semiconductor substrate, the semiconductor layer, and the diffusion layer (diffusion area). When one of the conductive types of the n-type and p-type is assumed as a first conductive type, and the other conductive type is assumed as a second conductive type, the first conductive type may be the p-type, while the second conductive type may be the n-type. On the contrary, the first conductive type may be the n-type, while the second conductive type may be the p-type.

What is claimed is:

1. A current detection circuit for detecting a current from a drive circuit comprising a first drive transistor provided on a high side of the drive circuit and having a first terminal provided on an external output terminal side outputting externally an output voltage of a drive circuit, a second terminal provided on an external input terminal side to which an input voltage is supplied externally from the drive circuit, and a control terminal, the current detection circuit comprising:
   a first sense transistor including a first terminal and a control terminal which are coupled respectively to the first terminal and the control terminal the first drive transistor, the first sense transistor being a same conductive type as the first drive transistor;
   a first operational amplifier configured to amplify a potential difference between a voltage of the second terminal of the first drive transistor and a voltage of a second terminal of the first sense transistor;
   a second operational amplifier configured to amplify a potential difference between a voltage of a first terminal of a second drive transistor and a voltage of a first terminal of a second sense transistor;
   a second resistance element provided between one of two input terminals of the second operational amplifier coupled to the ground voltage terminal with the first terminal of the second drive transistor and the ground voltage terminal; and
   a first current control transistor provided over a first current path through which a current from the first sense transistor flows, and having a control terminal to which an output voltage of the first operational amplifier is supplied,
   wherein a value of a current flowing through the first drive transistor is detected from a value of the current flowing through the first sense transistor, and
   the second resistance element is a transistor, in an ON state, having a same conductivity as the second sense transistor,
   the first operational amplifier operates, when the input voltage of the drive circuit is supplied as a low potential side source voltage, and when a first voltage higher than the input voltage is supplied as a high potential side source voltage.

2. The current detection circuit according to claim 1, wherein a differential voltage between the first voltage and the input voltage is equal to or lower than a withstand voltage of each transistor included in the first operational amplifier.

3. The current detection circuit according to claim 2, further comprising
   a regulator configured to generate the first voltage.

4. The current detection circuit according to claim 1, wherein there is provided a third current path, which discharges a current flowing from the first terminal to the second terminal of the first sense transistor, independently from the first current path.

5. The current detection circuit according to claim 1, further comprising
   a first constant current source provided between the second terminal of the first sense transistor and a ground voltage terminal.

6. The current detection circuit according to claim 1, further comprising:
   a first resistance element provided between one input terminal and other input terminal of the first operational amplifier; and
   a first switch element coupled in series with the first resistance element, and controlled to be turned ON/OFF complementarily with the first sense transistor.

7. The current detection circuit according to claim 6, wherein a resistance value of the first resistance element is approximately same as a resistance value when the first sense transistor is turned ON.

8. The current detection circuit according to claim 1, wherein the drive circuit further includes
   the second drive transistor is provided on a low side, and controlled to be turned ON/OFF based on a dead time existing therebetween complementarily with the first drive transistor, the second drive transistor having the first terminal provided on a ground voltage terminal side, the second terminal provided on the external output terminal side and a control terminal, and
   an inductor provided between the first and second drive transistors and the external output terminal,
   wherein the current detection circuit further includes
   the second sense transistor including a second terminal and a control terminal which are coupled respectively to the second terminal and the control terminal of the second drive transistor, and which is same conductive type as the second drive transistor,
   the second operational amplifier configured to amplify a potential difference between a voltage of the first terminal of the second drive transistor and a voltage of the first terminal of the second sense transistor, and
   a second current control transistor provided over a second current path through which a current flowing through the second sense transistor flows, and having a control terminal to which an output voltage of the second operational amplifier is supplied, and
   wherein a current flowing through the inductor is detected based on a value of the current flowing through each of the first and second sense transistors.

9. The current detection circuit according to claim 8, further comprising
   a voltage supply unit configured to supply a voltage, higher than a ground voltage supplied to the ground voltage terminal by a predetermined voltage, to one of two input terminals of the second operational amplifier coupled to the ground voltage terminal together with the first terminal of the second drive transistor.

10. The current detection circuit according to claim 8, further comprising:
    a second constant current source which supplies a current between the second resistance element and the one input terminal of the second operational amplifier.

11. The current detection circuit according to claim 1, wherein the second resistance element is a same size as the second sense transistor.

12. The current detection circuit according to claim 8, further comprising
    a switch transistor provided between one input terminal of the second operational amplifier and other input terminal thereof, and being controlled to be turned ON/OFF complementarily with the second sense transistor.

13. A current detection circuit comprising:
- an N-channel first sense transistor having a source and a gate coupled respectively to a source and a gate of an N-channel first drive transistor provided on a high side of a drive circuit;
- a first operational amplifier configured to amplify a potential difference between a drain voltage of the first drive transistor and a drain voltage of the first sense transistor;
- a second operational amplifier configured to amplify a potential difference between a voltage of a source of a second drive transistor and a voltage of a source of an N-channel second sense transistor;
- a second resistance element provided between one of two input terminals of the second operational amplifier coupled to the ground voltage terminal with the first terminal of the second drive transistor and the ground voltage terminal, the second resistance element being a transistor, in an ON state, having, a same conductivity as the second sense transistor; and
- a first current control transistor provided over a first current path through which a current flowing through the first sense transistor flows, and which has a gate to which an output voltage of the first operational amplifier is supplied, wherein a value of a current flowing through the first drive transistor is detected based on a value of the current flowing through the first sense transistor, and the first operational amplifier operates, when an input voltage of the drive circuit is supplied as a low potential side source voltage, and when a first voltage higher than the input voltage is supplied as a high potential side source voltage.

14. The current detection circuit according to claim 13, wherein the drive circuit further includes
- the second drive transistor which is provided on a low side, and is controlled to be turned ON/OFF based on a dead time exiting therebetween complementarily with the first drive transistor, and
- an inductor which is provided between the first and second drive transistors and an external output terminal, wherein the current detection circuit further includes
- the N-channel second sense transistor having a drain and a gate which are coupled respectively to a drain and a gate of the second drive transistor, and
- a second current control transistor provided over a second current path through which a current flowing through the second sense transistor flows, and which has a gate to which an output voltage of the second operational amplifier is supplied, and wherein a current flowing through the inductor is detected from a value of a current flowing through each of the first and second sense transistors.

* * * * *